(12) United States Patent
Wu

(10) Patent No.: US 9,615,446 B2
(45) Date of Patent: Apr. 4, 2017

(54) LOW CROSS-TALK DIFFERENTIAL MICROSTRIP LINES HAVING SLOTS THEREIN OF SUBWAVELENGTH CONFIGURATION

(71) Applicant: CHUNG HUA UNIVERSITY, Hsinchu (TW)

(72) Inventor: Chia-Ho Wu, Tainan (TW)

(73) Assignee: CHUNG HUA UNIVERSITY, Hsinchgu (TW)

( * ) Notice: Subject to any disclaimer, the term of this patent is extended or adjusted under 35 U.S.C. 154(b) by 0 days.

(21) Appl. No.: 14/459,751

(22) Filed: Aug. 14, 2014

(65) Prior Publication Data

US 2015/0236394 A1    Aug. 20, 2015

(30) Foreign Application Priority Data

Feb. 14, 2014   (TW) .............................. 103104920 A

(51) Int. Cl.
*H05K 1/02* (2006.01)
*H01P 3/02* (2006.01)
*H01P 3/08* (2006.01)

(52) U.S. Cl.
CPC ........... *H05K 1/0245* (2013.01); *H01P 3/026* (2013.01); *H01P 3/081* (2013.01)

(58) Field of Classification Search
CPC .......... H05K 1/0245; H01P 3/02; H01P 3/026
USPC ....................................................... 333/4, 5
See application file for complete search history.

(56) References Cited

U.S. PATENT DOCUMENTS

| | | | | |
|---|---|---|---|---|
| 5,027,088 A | * | 6/1991 | Shimizu et al. | ........ H01P 3/081 333/1 |
| 6,686,808 B1 | * | 2/2004 | Sugawara | ............... H01P 1/211 333/1 |
| 7,102,456 B2 | * | 9/2006 | Berg | ........................ H01P 3/081 333/238 |
| 2012/0133454 A1 | * | 5/2012 | Wu | ........................ H01P 3/026 333/33 |

OTHER PUBLICATIONS

Douglas Brooks, "Signal Integrity Issues and Printed Circuit Board Design", Jul. 4, 2003, p. 251-255, Prentice Hall.
(Continued)

*Primary Examiner* — Benny Lee
(74) *Attorney, Agent, or Firm* — Chun-Ming Shih

(57) ABSTRACT

The present invention discloses a pair of differential microstrip lines with low cross-talk for high-frequency signal transmission. The pair of microstrip lines comprises two microstrip lines. The first microstrip line is used to transmit the first transmission signal. The second microstrip line is parallel to the first microstrip line and used to transmit the second transmission signal. The first transmission signal is the complementary signal of the second transmission signal and has a 180° phase difference from the second transmission signal. Particularly, there are a plurality of slots periodically arranged on the outer sides of the first and the second microstrip lines to form a subwavelength configuration. The subwavelength configuration is to make the periodical arrangement length of these slots shorter than the wavelengths of the first and the second transmission signals. These slots can provide subwavelength confinement for enhancing electromagnetic wave.

13 Claims, 30 Drawing Sheets

(56) References Cited

OTHER PUBLICATIONS

Eric Bogatin, "Signal and Power Integrity-SIMPLIFIED", Jul. 31, 2009, p. 475-499, Prentice Hall Modern Semiconductor Design Series Prentice Hall signal Integrity Library.

* cited by examiner

LOW CROSS-TALK DIFFERENTIAL MICROSTRIP LINES HAVING SLOTS THEREIN OF SUBWAVELENGTH CONFIGURATION

CROSS-REFERENCE TO RELATED APPLICATION

This application claims the benefit of Taiwan Patent Application No. 103104920, filed on Feb. 14, 2014, in the Taiwan Intellectual Property Office, the disclosure of which is incorporated herein in its entirety by reference.

BACKGROUND OF THE INVENTION

1. Field of the Invention

The present invention generally relates to a transmission line, in particular to low cross-talk differential microstrip lines for high-frequency signal transmission.

2. Description of the Related Art

In recently years, since signal transmission rates become higher, and the size of electronic products becomes smaller, electronic circuits tend to be designed to be denser. Thus, the cross-talk between electronic circuits becomes serious. When signals are transmitted via transmission lines, the adjacent transmission lines will be interfered by each other due to the electromagnetic wave coupling phenomenon; as a result, the interfered transmission lines may generate coupling voltage and current, which is so-called cross-talk. Excessive cross-talk may influence the efficiency of the system; further, some components of the system may be triggered by accident, which may damage the system. Besides, when parts of an electronic circuit should be designed to be bent, engineers usually increase the interval between the adjacent microstrip lines, or increase the rising and falling time of the digital signals to reduce the cross-talk; however, the cross-talk still cannot be completely eliminated.

As the conventional methods cannot effectively eliminate the cross-talk occurring between transmission lines, it is necessary to propose novel differential microstrip lines with low cross-talk for high-frequency signal transmission for the purpose of suppressing the cross-talk and reducing the mode conversion effect between the differential mode and the common mode.

SUMMARY OF THE INVENTION

When signals are transmitted through microstrip lines, most of the surface current will be distributed at the edges of the microstrip lines. In other words, the edges of the lines have very high current density. The invention is to etch periodical subwavelength corrugations along the edges of the microstrip lines to introduce the current at the edges into the slots to form an approximately closed loop. This subwavelength structure is favorable to increase the self-inductance of the circuit and confine the magnetic field around the lines, which could greatly reduce the cross-talk due to the mutual inductance between the adjacent circuits. The confinement effect of the magnetic field could be controlled by the configuration and depth of the slots.

A periodical structure in the conventional microstrip circuits is usually for band stop filters; however, the periodical structure is not so practical because of its long length. Besides, another purpose of the periodical structure in the conventional microstrip circuits is to serve as a proper R-L structure for coupling adjacent circuits. Therefore, the concept of the invention is different from the above two conventional circuits. As the purposes of the periodical structures in the conventional microstrip circuits are deeply rooted in those skilled in the art, it is impossible for those skilled in the art to use a periodical structure as a main signal transmission body. Additionally, the circuit design softwares used by those skilled in the art usually do not support this kinds of circuits; therefore, it is inconceivable for those skilled in the art to use this kinds of circuits as a signal line. Currently, there are two common methods to suppress cross-talk. First one is to bend the differential pair and the single-ended line many turns to reduce cross-talk; however, the method may generate the common mode signal in the differential pair, which is unfavorable to the operation of the whole circuit. The other one is to install additional guard trace grounded lines between adjacent loops; however, the method could result in two obvious shortcomings First, the areas of the loops cannot be effectively deceased. Second, the guard trace grounded lines can block out the electrical field between the two loops, but cannot effectively suppress the mutual inductance between lines. According to the present invention, corrugate paths are sculptured on the surface of a conductor to serve as the microstrip line, and the current distributed over the edge of the line will flow into the corrugate paths to form a quasi closed loop, which can effectively confine the magnetic field and suppress the cross-talk resulting from the mutual inductance. The confinement will become stronger if the frequency of the signal is higher. As the periodical length is much shorter than the wavelength; therefore, the working frequency of the microstrip line according to the present invention is away from the band gap of the periodic structure, and the main function of the microstrip line according to the present invention is to transmit signal rather than reflect signal. Accordingly, the application of the invention is different from filter. The present invention is applicable to high-frequency microwave circuit and high-speed circuit; in particular, the present invention can effectively isolate the mutual interference in high density circuits. The differential pair is mainly used to transmit complementary signals; and, the differential pair has better anti-jamming performance, but needs more signal lines than the single-ended transmission line; therefore, the circuit area of the differential pair is bigger. So as to reduce the circuit area of the differential pair, the distances between the differential pair and other transmission lines need to be further decreased, which will bring about serious cross-talk and mode conversion effect between the differential signal and common mode signal. Thus, it is necessary to use an innovative transmission line to replace the conventional differential microstrip lines. The differential pair includes two transmission lines, and both of the two transmission lines are used to transmit signals; however, there is a 180° phase difference between the signals transmitted by the two transmission lines, which is different from the single-ended transmission line.

One of the primary objects of the present invention is to provide a pair of differential microstrip lines with low cross-talk for high-frequency signal transmission. The differential microstrip lines are comprised of two microstrip lines. The first microstrip line is used for transmitting the first transmission signal, and has a plurality of slots arranged periodically. The second microstrip line is used for transmitting the second transmission signal, which is parallel to the first microstrip line and has a plurality of slots arranged periodically. The second transmission signal is a complementary signal of the first transmission signal and has a 180° phase difference from the first transmission signal. In particular, the slots are periodically arranged along outer sides of the first microstrip line and the second microstrip line to form a subwavelength configuration making the periodical length of these arranged slots shorter than the wavelengths of the first and the second transmission signals, so that the slots is capable of enhancing subwavelength confinement for the electromagnetic wave.

In a preferred embodiment, the differential microstrip lines further comprise two terminals. The first terminal respectively receives the complementary signals from the first microstrip line and the second microstrip line; the second terminal respectively outputs the complementary signals from the first microstrip line and the second microstrip line, wherein the slot are arranged along the edges of the microstrip lines. Whereby, the slots reduce the energy cross-talk effect from the adjacent microstrip lines or differential pair, or reduce the mode conversion effect between the differential mode and the common mode when the first terminal transmits the complementary signal to the second terminal.

In a preferred embodiment, the differential microstrip lines further comprise a plurality of slots periodically arranged along the inner side of the first microstrip line opposite the outer side of the first microstrip line; and a plurality of slots periodically arranged along the inner side of the second microstrip line opposite the outer side of the second microstrip line.

The low cross-talk differential microstrip lines for high-frequency signal transmission according to the present invention have the following advantages:

The low cross-talk differential microstrip lines for high-frequency signal transmission according to the present invention can effectively solve the cross-talk and mode conversion effect to improve signal transmission quality and reduce the size of the circuit board.

The low cross-talk differential microstrip lines for high-frequency signal transmission according to the present invention have periodical slots with subwavelength size, and the shape and the size of the slots can be adjusted with the actual design in order to depress the electromagnetic wave above the slots by artificial surface plasmon polaritons.

BRIEF DESCRIPTION OF THE DRAWINGS

The detailed structure, operating principle and effects of the present invention will now be described in more details hereinafter with reference to the accompanying drawings that show various embodiments of the invention as follows.

DETAILED DESCRIPTION OF THE PREFERRED EMBODIMENTS

The technical content of the present invention will become apparent by the detailed description of the following embodiments and the illustration of related drawings as follows.

Figure 1:
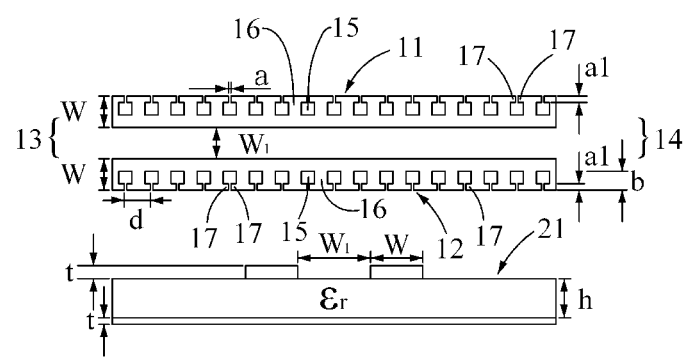
FIG. 1 is a schematic view of a differential pair with opening-type periodical subwavelength configuration in accordance with the present invention.

The first embodiment of the present invention is, as shown in FIG. 1, a differential pair of microstrip lines with the opening-type periodical subwavelength configuration, wherein the differential pair is composed of two microstrip lines, the first microstrip line 11 and the second microstrip line 12, with periodical subwavelength configurations. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15. Two adjacent rectangular convex bodies 16 are divided by one rectangular concave body 15, and each of the rectangular convex bodies 16 comprises two first extended portions 17 parallel extend to centers of the adjacent slots respectively.

The width of the two microstrip lines is W, the distance between the two microstrip lines is $W_1$, the thickness of the two microstrip lines is t, the thickness of the substrate 21 is h, the periodical arrangement length of the two microstrip lines is d, the depth of the slots is b, the width of the opening of the slots is a, the dielectric constant of the medium of the substrate 21 is $\in_r$, and the thickness of the first extended portion 17 is $a_1$. If there is a single-ended microstrip line or another differential pair beside the conventional differential pair without slots, two obvious phenomena will take place. The first phenomenon is that an obvious mode conversion effect between the differential mode and common mode will occur between the first terminal 13 and the second terminal 14. The second phenomenon is that the complementary signals inputted into the first terminal 13 will bring about cross-talk to the adjacent microstrip lines or differential pairs. The numerical analysis of the coupling circuit configuration shown in FIG. 2 can prove that the differential pair with the periodical subwavelength configuration can dramatically suppress the cross-talk between adjacent microstrip lines and reduce the mode conversion effect between the differential mode and common mode.

Figure 2:
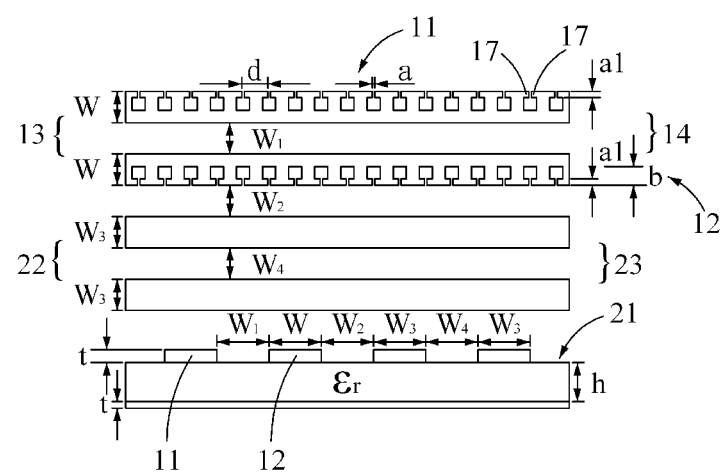
FIG. 2 is a schematic view of a coupling circuit of a conventional differential pair and the differential pair with opening-type periodical subwavelength configuration in accordance with the present invention.
Figure 3:
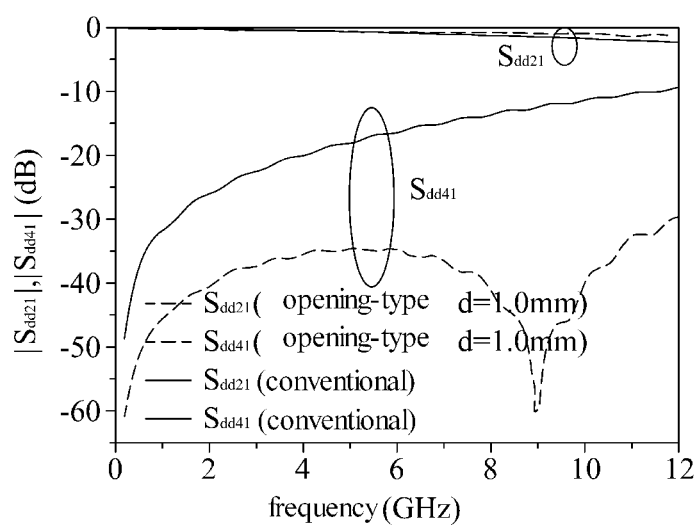
FIG. 3 is a schematic view of the cross-talk between the conventional differential pair and the differential pair with the opening-type periodical subwavelength configuration in accordance with the present invention, where $S_{dd21}$ stands for signal transmission ability, and $S_{dd41}$ stands for cross-talk.
Figure 4:
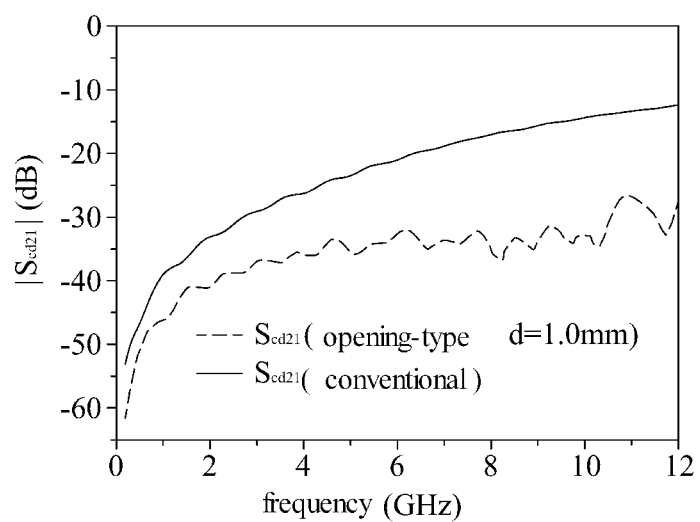
FIG. 4 is a schematic view of the mode conversion effect between differential mode and common mode of the differential pair with opening-type periodical subwavelength configuration in accordance with the present invention, where $S_{cd21}$ stands for mode conversion effect.

FIG. 2 shows a coupling circuit which consists of two microstrip lines with periodically arranged subwavelength slots and a conventional differential pair (the distance between the microstrip lines is $W_4$); the configuration of the slots comprises a plurality of rectangular convex bodies continuously and periodically combined with a plurality of rectangular concave bodies, and the two adjacent rectangular convex bodies are divided by one rectangular concave body, and each of the rectangular convex bodies comprises two first extended portions 17 parallel extend to centers of the adjacent slots respectively; in FIG. 2, the width of the two microstrip lines is W, the distance between the two microstrip lines is $W_1$, the thickness of the two microstrip lines is t, the thickness of the substrate 21 is h, the periodical arrangement length of the two microstrip lines is d, the depth of the slots is b, the width of the opening of the slots is a, the dielectric constant of the medium of the substrate 21 is $\in_r$, and the thickness of the first extended portion 17 is $a_1$. $S_{dd21}$ can be obtained by inputting differential signals into the first terminal 13 and analyzing the output signals from the second terminal 14, which clearly shows the transmission ability of the differential pairs. $S_{dd41}$ can be obtained by inputting differential signals into the first terminal 13 and analyzing the output signals from the fourth terminal 23, which clearly shows the cross-talk between the differential pair (11, 12) and the conventional differential pair. The distance between the two differential pairs is $W_2$. In FIG. 3, the S parameter, $S_{dd21}$, stands for the transmission ability of the differential signals which are inputted into the first terminal 13 and outputted from the second terminal 14. The S parameter, $S_{dd41}$, stands for the generated cross-talk effect when differential signals are inputted into the first terminal 13 and outputted from the fourth terminal 23 of the conventional differential pair. In FIG. 4, the S parameter, $S_{cd21}$, stands for the generated mode conversion effect from the differential mode to the common mode when differential signals are inputted into the first terminal 13 and outputted from the second terminal 14. The "conventional" in the figures stands for the transmission and cross-talk effects of the differential pair without the periodical subwavelength configuration, which are illustrated by solid lines. The transmission and cross-talk effects of the differential pair with the periodical subwavelength configuration, or "opening-type", are illustrated by dashed lines. The simulation parameters of FIG. 3 and FIG. 4 are shown in FIG. 2 as follows: $W=W_1=W_2=W_3=W_4=1.2$ mm, the total length of the microstrip line is 10 cm, the material of the substrate 21 is RO4003, the thickness of the metal film (t) is 0.0175 mm, the thickness of the substrate (h) is 0.508 mm, the depth of the slot (b) is 0.6 W and the periodical arrangement length (d) is 1.0 mm, and the analysis range is from 200 MHz to 12 GHz. In FIG. 2, the first terminal 13 receives the differential signals complementary to each other, the second terminal 14 is the receiver of the differential pair, the third terminal 22 is the near end of the conventional differential pair and the fourth terminal 23 is the remote end of the conventional differential pair. In FIG. 3, $S_{dd21}$ stands for the signal transmission ability of the differential pairs and $S_{dd41}$ stands for the cross-talk between the adjacent differential pairs. In FIG. 4, $S_{cd21}$ stands for the mode conversion effect from the differential signal to the common mode signal.

In the appropriate graphs of FIG. 3 and FIG. 4, the unit of the S parameters is dB, and the unit of the signal frequency is GHz. In the first embodiment, if both differential pairs are conventional differential pairs, the simulation result can be illustrated by the solid lines of FIG. 3 and FIG. 4. As shown in FIG. 3, when the differential signals are inputted into the first terminal 13 and outputted from the second terminal 14, the transmission ability of the conventional differential pair is expressed by the S parameter, $S_{dd21}$: $S_{dd21}$=−0.08821 dB when the signal frequency is 200 MHz, $S_{dd21}$=−2.32492 dB when the signal frequency is 12 GHz. The cross-talk of the conventional differential pair (i.e. the differential signals are inputted into the first terminal 13 and outputted from the fourth terminal 23) is expressed by the S parameter, $S_{dd41}$: $S_{dd41}$=−48.35245 dB when the signal frequency is 200 MHz, $S_{dd41}$=−9.38157 dB when the signal frequency is 12 GHz. As shown in FIG. 4, the mode conversion effect between the differential mode to common mode when the differential signals are inputted into the first terminal 13 and outputted from the second terminal 14 is expressed by the S parameter, $S_{cd21}$: $S_{cd21}$=−12.37439 dB when the signal frequency is 120 Hz.

In the first embodiment, if one of the differential pairs is a conventional differential pair and the other one is a differential pair with the periodical subwavelength configuration, the simulation result can be illustrated by the dashed lines of FIG. 3 and FIG. 4. As shown in FIG. 3, the transmission ability of the differential signals which are inputted into the first terminal 13 and outputted from the second terminal 14 is expressed by the S parameter, $S_{dd21}$: $S_{dd21}$=−0 0.07 573 dB when the signal frequency is 200 MHz, and $S_{dd21}$=−1.21404 dB when the signal frequency is 12 GHz. As shown in FIG. 3, the cross-talk of the differential signals which are inputted into the first terminal 13 and outputted from the fourth terminal 23 is expressed by the S parameter, $S_{dd41}$: $S_{dd41}$=−60.6408 dB when the signal frequency is 200 MHz, $S_{dd41}$=−29.62501 dB when the signal frequency is 12 GHz and the maximum of the cross-talk between 1 GHz-10 GHz is $S_{dd41}$=−34.538 dB when the signal frequency is 5.1 GHz. As shown in FIG. 4, when the differential signals are inputted into the first terminal 13 and outputted from the second terminal 14, the mode conversion effect between the differential mode to common mode is expressed by the S parameter, $S_{cd21}$: $S_{cd21}$=−27.66008 dB when the signal frequency is 12 GHz.

In the first embodiment, the overall comparison results between the conventional differential pair and the differential pair with the periodical subwavelength configuration are shown in FIG. 3 and FIG. 4. As shown in FIG. 3, the transmission ability of the conventional differential pair is $S_{dd21}$=−2.32492 dB when the signal frequency is 12 GHz; the transmission ability of the differential pair with the periodical subwavelength configuration is $S_{dd21}$=−1.21404 dB when the signal frequency is 12 GHz. The transmission ability is obviously improved at high signal frequency. As shown in FIG. 3, when the signal frequency is 12 GHz, the cross-talk of the conventional differential pair is $S_{dd41}$=−9.38157 dB and that of the differential pair with the periodical subwavelength configuration is $S_{dd41}$=−29.62501 dB; obviously, the cross-talk is significantly suppressed. As shown in FIG. 4, when the signal frequency is 12 GHz, the mode conversion effect between the differential mode and the common mode of the conventional differential pair is $S_{cd21}$=−12.37439 dB and that of the differential pair with the periodical subwavelength configuration is $S_{cd21}$=−27.66008 dB; obviously, the mode conversion effect is significantly decreased. Note: FIG. 3 is the S parameter calculation result of the coupling circuit of FIG. 2. Please refer to FIG. 3, $S_{dd21}$ of the conventional differential pair is illustrated by a solid line, which shows its transmission ability is −0.08821 dB when the signal frequency is 200 MHz, and is −2.32492 dB when the signal frequency is 12 GHz. $S_{dd21}$ of the differential pair with the periodical subwavelength configuration is illustrated by a dashed line, which shows its transmission ability is −0.07573 dB when the signal frequency is 200 MHz, and is −1.21404 dB when the signal frequency is 12 GHz. Apparently, the differential pair with the periodical subwavelength configuration has better transmission ability and confinement of the electromagnetic field. With the strong confinement of the electromagnetic field, the differential pair with the periodical subwavelength configuration will not result in serious interference to adjacent microstrip lines. With the increase of the frequency, the cross-talk will become more obvious. The cross-talk between the conventional differential pairs is $S_{dd41}$=−9.38157 dB when the signal frequency is 12 GHz; and the cross-talk between the conventional differential pair and the differential pair with periodical subwavelength configuration is $S_{dd41}$=−29.62501 dB when the signal frequency is 12 GHz, which effectively reduces the cross-talk. FIG. 4 shows the relation between the mode conversion effect and the frequency. With the increase of the frequency, the mode conversion effect will become more obvious. However, the differential pair with periodical subwavelength configuration can effectively suppress the mode conversion effect. The mode conversion effect of the conventional differential pair is $S_{cd21}$=−12.37439 dB when the signal frequency is 12 GHz, and the mode conversion effect of the differential pair with periodical subwavelength configuration is $S_{cd21}$=−27.66008 dB; therefore, the periodical subwavelength configuration can greatly suppress the mode conversion effect between the differential mode and common mode.

Figure 5:
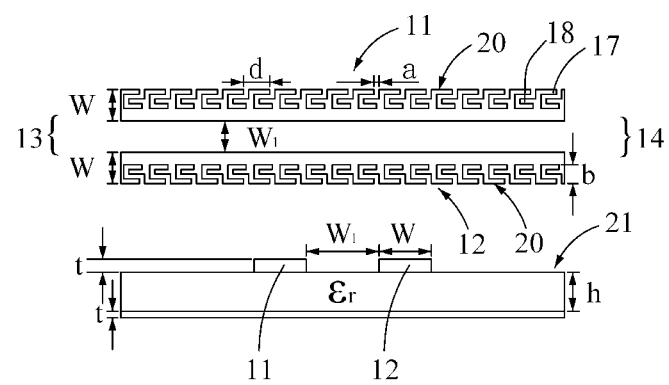
FIG. 5 is a schematic view of a differential pair with hairpin-type periodical subwavelength configuration in accordance with the present invention.
Figure 6:
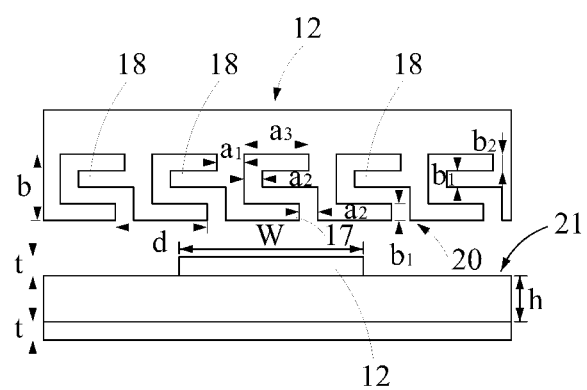
FIG. 6 is a schematic view of the detailed structure of the differential pair with hairpin-type periodical subwavelength configuration in accordance with the present invention.

The second embodiment of the present invention is, as shown in FIG. 5 and FIG. 6, a differential pair with the hairpin-type periodical subwavelength configuration. As shown in FIG. 5, the differential pair is composed of two microstrip lines, the first microstrip line 11 (FIG. 5) and the second microstrip line 12 (FIG. 5), with periodical subwavelength configurations. As shown in FIG. 5, the signals are inputted into the first terminal 13 (FIG. 5) and outputted from the second terminal 14 (FIG. 5). The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of Z-shaped convex bodies 20 arranged continuously and periodically, and each of the Z-shaped convex bodies 20 comprises two extended portions 17, 18, wherein the first extended portion 17 parallel extends from the opening of one slot to the center of the adjacent slot; and the second extended portion 18 parallel extends from the middle of the Z-shaped convex body 20 to the center of another adjacent slot. The direction where the first extended portion 17 extends is inverse to the direction where the second extended portion 18 extends.

Figure 7:
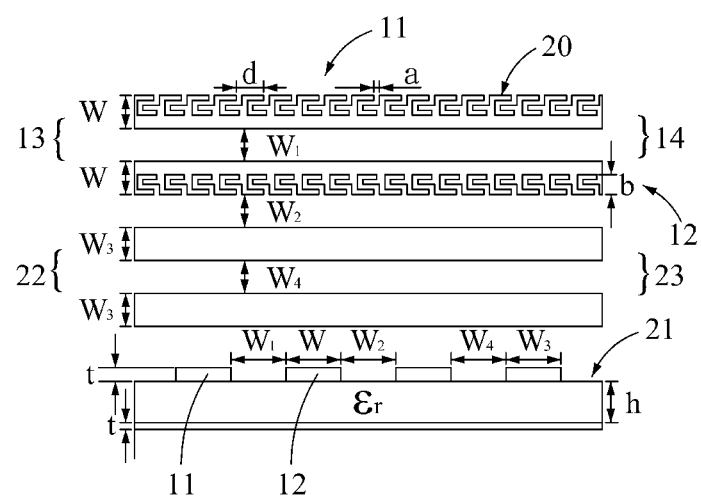
FIG. 7 is a schematic view of a coupling circuit of a conventional differential pair and the differential pair with hairpin-type periodical subwavelength configuration in accordance with the present invention.
Figure 8:
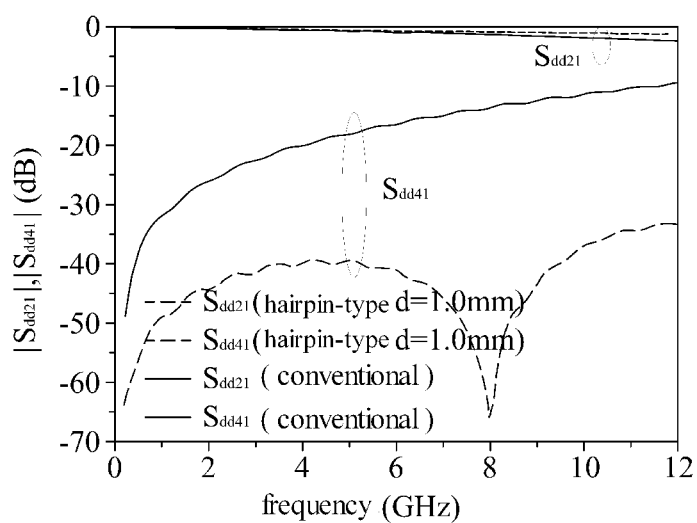
FIG. 8 is a schematic view of the cross-talk between the conventional differential pair and the differential pair with the hairpin-type periodical subwavelength configuration in accordance with the present invention, where $S_{dd21}$ stands for signal transmission ability, and $S_{dd41}$ stands for cross-talk.
Figure 9:
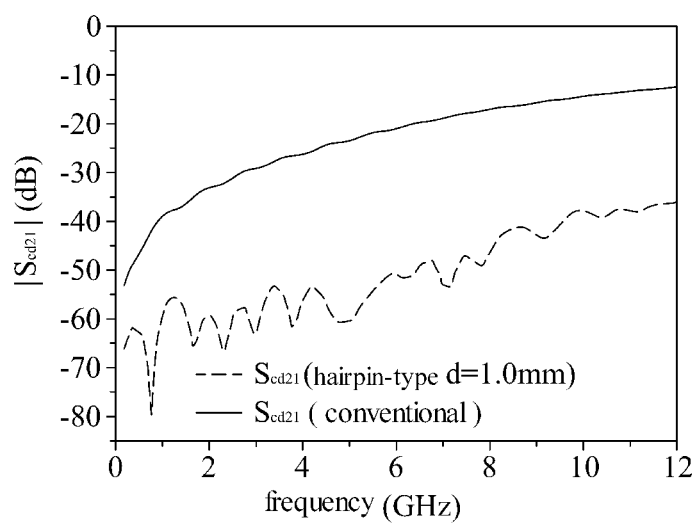
FIG. 9 is a schematic view of the mode conversion effect between differential mode and common mode of the differential pair with hairpin-type periodical subwavelength configuration in accordance with the present invention, where $S_{cd21}$ stands for mode conversion effect.

The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the opening of the slots is a, as shown in FIG. 5, and the dielectric constant of the medium of the substrate 21 is $\in_r$, as shown in FIG. 5. As shown in FIG. 6, there are still other structure parameters, such as $a_1$, $a_2$ (the widths of the outer openings), $a_3$ (the width of the inner openings), $b_1$ (the width of the thin metal bars) and $b_2$ (the interval of the thin metal bars). If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. The numerical analysis of the coupling circuit configuration shown in FIG. 7 can prove that the differential pair with the hairpin-type periodical subwavelength configuration can dramatically suppress the cross-talk between the adjacent microstrip lines and reduce the mode conversion effect between the differential mode and the common mode. FIG. 7 shows a coupling circuit composed of a conventional differential pair and a differential pair with the hairpin-type periodical subwavelength configuration. $S_{dd21}$ can be obtained by inputting differential signals into the first terminal 13 and analyzing the output signals from the second terminal 14, which clearly shows the transmission ability of the differential pairs. The cross-talk between the conventional differential pair and differential pair (11, 12) can be acquired by analyzing the outputs from the fourth terminal 23. The width of the two microstrip lines is W, the distance between the two microstrip lines is $W_1$, the distance between the two differential pairs is $W_2$, the thickness of the metal film is t, the thickness of the substrate 21 is h, the periodical arrangement length of the two microstrip lines is d, the depth of the slots is b, the width of the opening of the slots is a, the dielectric constant of the medium of the substrate 21 is $\in_r$ and the Z-shaped convex body is 20. In FIG. 8, the S parameter, $S_{dd21}$, stands for the transmission ability of differential signals which are inputted into the first terminal 13 and outputted from the second terminal 14. The S parameter, $S_{dd41}$, stands for the generated cross-talk effect when differential signals are inputted into the first terminal 13 and outputted from the fourth terminal 23 of the conventional differential pair. In FIG. 9, the S parameter, $S_{cd21}$, stands for the generated mode conversion effect from the differential mode to common mode when differential signals are inputted into the first terminal 13 and outputted from the second terminal 14. In FIGS. 8, 9, the "conventional" in the figures stands for the transmission and cross-talk effects of the differential pair without the periodical subwavelength configuration, which are illustrated by solid lines. The transmission and cross-talk effects of the differential pair with the periodical subwavelength configuration, or "hairpin-type", are illustrated by dashed lines. The simulation parameters are shown in FIG. 7 as follows: $W=W_1=W_2=W_3=W_{4=1.2}$ mm, the total length of the microstrip line is 10 cm, the material of the substrate 21 is RO4003, the thickness of the metal film (t) is 0.0175 mm, the thickness of the substrate (h) is 0.508 mm, the depth of the slot (b) is 0.6 W and the periodical arrangement length (d) is 1.0 mm, and the analysis range is from 200 MHz to 12 GHz. In FIG. 7, the first terminal 13 receives the differential signals complementary to each other, the second terminal 14 is the receiver of the differential pair, the third terminal 22 is the near end of the conventional differential pair and the fourth terminal 23 is the remote end of the conventional differential pair. The simulation parameters of FIG. 8 are the same with those of FIG. 7. The S parameter, $S_{dd21}$, stands for the signal transmission ability. The S parameter, $S_{dd41}$, stands for the cross-talk effect between the differential pair with the periodical subwavelength configuration and the conventional differential pair. The S parameter, $S_{cd21}$, stands for the mode conversion effect from the differential signal to the common mode signal.

In the second embodiment, if both differential pairs are conventional differential pairs, the simulation result can be illustrated by the solid lines of FIG. 8 and FIG. 9. As shown in FIG. 8, when the differential signals are inputted into the first terminal 13 and outputted from the second terminal 14, the transmission ability is expressed by the S parameter, $S_{dd21}$: $S_{dd21}$=−0.08821 dB when the signal frequency is 200 MHz, $S_{dd21}$=−2.32492 dB when the signal frequency is 12 GHz. As shown in FIG. 8, the cross-talk of the conventional differential pair (i.e. the differential signals are inputted into the first terminal 13 and outputted from the fourth terminal 23) is expressed by the S parameter, $S_{dd41}$: $S_{dd41}$=−48.55245 dB when the signal frequency is 200 MHz, $S_{dd41}$=−9.38157 dB when the signal frequency is 12 GHz. As shown in FIG. 9, the mode conversion effect between the differential mode to common mode when the differential signals are inputted into the first terminal 13 and outputted from the second terminal 14 is expressed by the S parameter, $S_{cd21}$: $S_{cd21}$=−12.37439 dB when the signal frequency is 12 GHz.

In the second embodiment, the simulation result of the coupling circuit of the conventional differential pair and the differential pair with the hairpin-type periodical subwavelength configuration can be illustrated by the dashed lines of FIG. 8 and FIG. 9.

As shown by the dashed lines of FIG. 8, the transmission ability of differential signals which are inputted into the first terminal 13 and outputted from the second terminal 14 is expressed by the S parameter, $S_{dd21}$: $S_{dd21}$=−0.09344 dB when the signal frequency is 200 MHz, and $S_{dd21}$=−1.20989 dB when the signal frequency is 12 GHz. As shown in FIG. 8, the cross-talk of the differential signals which are inputted into the first terminal 13 and outputted from the fourth terminal 23 is expressed by the S parameter, $S_{dd41}$: $S_{dd41}$=−63.57423 dB when the signal frequency is 200 MHz, and $S_{dd41}$=−33.33179 dB when the signal frequency is 12 GHz. As shown in FIG. 9, when the differential signals are inputted into the first terminal 13 and outputted from the second terminal 14, the mode conversion effect between the differential mode to the common mode is expressed by the S parameter, $S_{cd21}$: $S_{cd21}$=−35.91338 dB when the signal frequency is 12 GHz.

In the second embodiment, the overall comparison results between the conventional differential pair and the differential pair with the hairpin-type periodical subwavelength configuration are shown in FIG. 8 and FIG. 9. As shown in FIG. 8, the transmission ability that both the differential pairs are conventional differential pairs is $S_{dd21}=-2.32492$ dB when the signal frequency is 12 GHz; the transmission ability of the differential pair with the periodical subwavelength configuration is $S_{dd21}=-1.20989$ dB when the signal frequency is 12 GHz. The transmission ability is obviously improved at high signal frequency. As shown in FIG. 8, when the signal frequency is 12 GHz, the cross-talk between the two conventional differential pairs is $S_{dd41}=-9.38157$ dB and the cross-talk between the conventional differential pair and the differential pair with the periodical subwavelength configuration is $S_{dd41}=-33.33179$ dB; obviously, the cross-talk is significantly suppressed. As shown in FIG. 9, when the signal frequency is 12 GHz, the mode conversion effect between the conventional differential pairs is $S_{cd21}=-12.37439$ dB and that of the differential pair with the periodical subwavelength configuration is $S_{cd21}=-35.91338$ dB; obviously, the mode conversion effect is significantly decreased. Note: FIG. 8 is the S parameter calculation result of the coupling circuit of FIG. 7. Please refer to FIG. 8, $S_{dd21}$ of the conventional differential pair is illustrated by a solid line, which shows its transmission ability is −0.08821 dB when the signal frequency is 200 MHz, and is −2.32492 dB when the signal frequency is 12 GHz. $S_{dd21}$ of the differential pair with the hairpin-type periodical subwavelength configuration is illustrated by a dashed line, which shows its transmission ability is −0.09344 dB when the signal frequency is 200 MHz, and is −1.20989 dB when the signal frequency is 12 GHz. The conventional differential pair has a little bit better transmission ability at low frequency. With the increase of the frequency, the differential pair with periodical subwavelength configuration will have better transmission ability and confinement of the electromagnetic field. With the strong confinement of the electromagnetic field, the differential pair with the hairpin-type periodical subwavelength configuration will not result in serious interference to adjacent microstrip lines. With the increase of the frequency, the cross-talk will become more obvious. The cross-talk between the conventional differential pairs is $S_{dd41}=-9.38157$ dB when the signal frequency is 12 GHz However, the cross-talk between the conventional differential pair and the differential pair with the hairpin-type periodical subwavelength configuration is $S_{dd41}=-33.33179$ dB, which effectively reduces the cross-talk. FIG. 9 shows the relation between the mode conversion effect and the frequency. With the increase of the frequency, the mode conversion effect will become more obvious. However, the differential pair with hairpin-type periodical subwavelength configuration can effectively suppress the mode conversion effect. The mode conversion effect of the conventional differential pair is $S_{cd21}=-12.37439$ dB when the signal frequency is 12 GHz; and the mode conversion effect of the differential pair with the hairpin-type periodical subwavelength configuration is $S_{cd21}=-35.91338$ dB; therefore, the periodical subwavelength configuration can greatly suppress the mode conversion effect between the differential mode and common mode.

Figure 10:
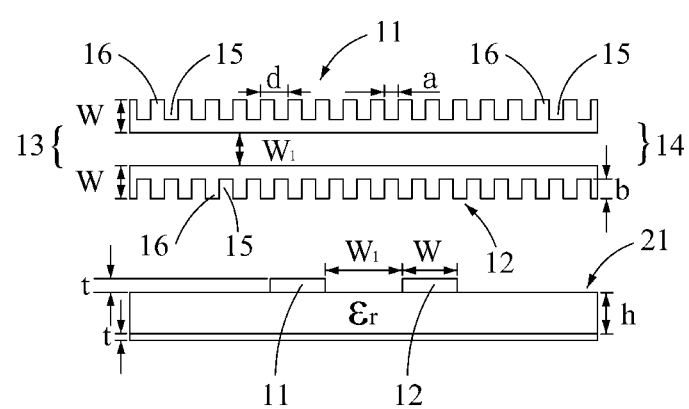
FIG. 10 is a schematic view of a differential pair with slot-type periodical subwavelength configuration in accordance with the present invention.

The third embodiment of the present invention is, as shown in FIG. 10, a differential pair with the slot-type periodical subwavelength configuration. The differential pair is composed of two microstrip lines, the first microstrip line 11 and the second microstrip line 12, with the slot-type periodical subwavelength configuration. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and the interval of the two adjacent rectangular convex bodies 16 is the periodical arrangement length of these slots. The width of the two microstrip lines is W, the distance between the two microstrip lines is $W_1$, the thickness of the metal film is t, the thickness of the substrate 21 is h, the periodical arrangement length of the two microstrip lines is d, the width of the opening of the slots is a, the depth of the slots is b, and the dielectric constant of the medium of the substrate 21 is $\in_r$. If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs.

Figure 11:
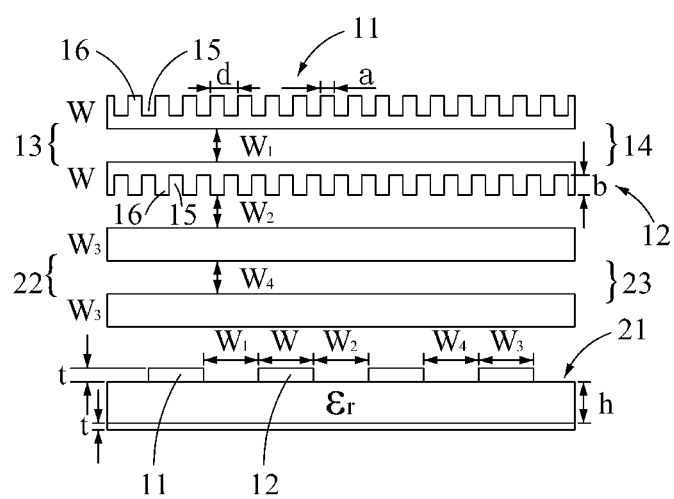
FIG. 11 is a schematic view of a coupling circuit of a conventional differential pair and the differential pair with slot-type periodical subwavelength configuration in accordance with the present invention.
Figure 12:
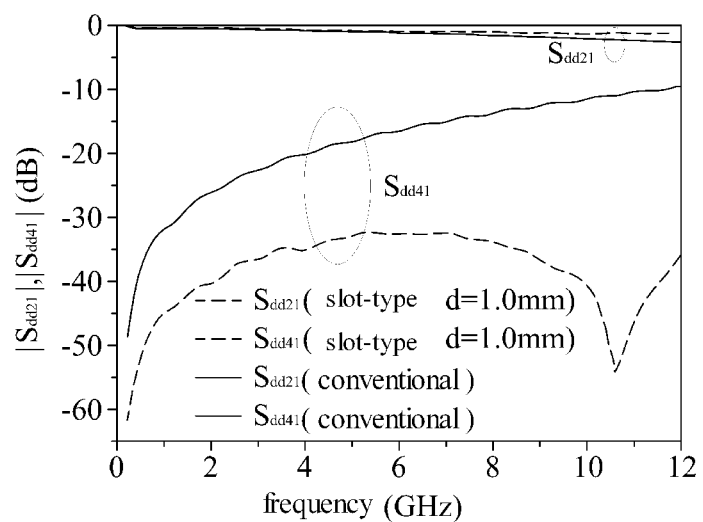
FIG. 12 is a schematic view of the cross-talk between the conventional differential pair and the differential pair with the slot-type periodical subwavelength configuration in accordance with the present invention, where $S_{dd21}$ stands for signal transmission ability, and $S_{dd41}$ stands for cross-talk.
Figure 13:
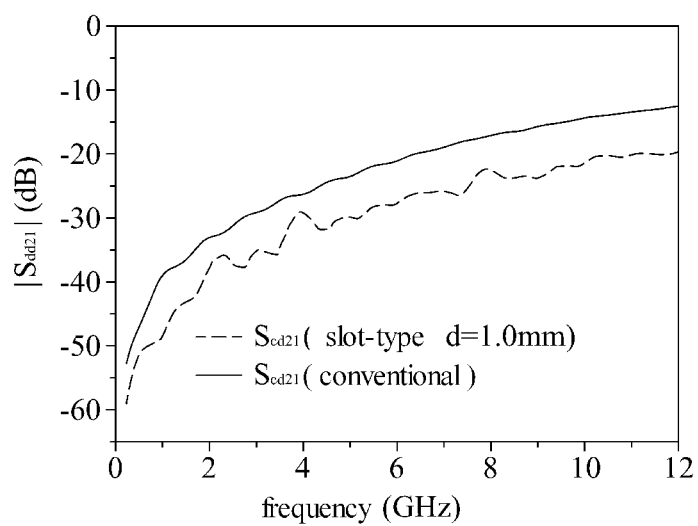
FIG. 13 is a schematic view of the mode conversion effect between differential mode and common mode of the differential pair with slot-type periodical subwavelength configuration in accordance with the present invention, where $S_{cd21}$ stands for mode conversion effect.

The numerical analysis of the coupling circuit configuration shown in FIG. 11 can prove that the differential pair with the periodical subwavelength configuration can dramatically suppress the cross-talk between the adjacent microstrip lines and reduce the mode conversion effect between the differential mode and the common mode. FIG. 11 shows a coupling circuit composed of a conventional differential pair and a differential pair with the slot-type periodical subwavelength configuration; the differential pair is composed of two microstrip lines, the first microstrip line 11 and the second microstrip line 12; the configuration of the slots comprises a plurality of rectangular convex bodies 16 continuously and periodically combined with a plurality of rectangular concave bodies 15, and the two adjacent rectangular convex bodies 16 are divided by one rectangular concave body 15; in FIG. 11, the width of the two microstrip lines is W, the distance between the two microstrip lines is $W_1$, the distance between the two differential pairs is $W_2$, the thickness of the metal film is t, the thickness of the substrate 21 is h, the periodical arrangement length of the two microstrip lines is d, the depth of the slots is b, the width of the rectangular convex bodies 16 is a, and the dielectric constant of the medium of the substrate 21 is $\in_r$. $S_{dd21}$ can be obtained by inputting differential signals into the first terminal 13 and analyzing the output signals from the second terminal 14, which clearly shows the transmission ability of the differential pairs. $S_{dd41}$ can be obtained by inputting differential signals into the first terminal 13 and analyzing the output signals from the fourth terminal 23 of the conventional differential pair, which clearly shows the cross-talk of the differential pairs. The distance between the two differential pairs is $W_2$. In FIG. 12, the S parameter, $S_{dd21}$, stands for the transmission ability of differential signals which are inputted into the first terminal 13 and outputted from the second terminal 14. The S parameter, $S_{dd41}$, stands for the generated cross-talk effect when differential signals are inputted into the first terminal 13 and outputted from the fourth terminal 23 of the conventional differential pair. In FIG. 13, the S parameter, $S_{cd21}$, stands for the generated mode conversion effect from the differential mode to common mode when differential signals are inputted into the first terminal 13 and outputted from the second terminal 14. In FIGS. 12, 13, the "conventional" in the figures stands for the transmission and cross-talk effects of the differential pair without the periodical subwavelength configuration, which are illustrated by solid lines. The transmission and cross-talk effects of the differential pair with the periodical subwavelength configuration, or slot-type, are illustrated by dashed lines. The simulation parameters are shown in FIG. 11 as follows: $W=W_1=W_2=W_3=W_4=1.2$ mm, the total length of the microstrip line is 10 cm, the material of the substrate 21 is RO4003, the thickness of the metal film (t) is 0.0175 mm, the thickness of the substrate (h) is 0.508 mm, the depth of the slot (b) is 0.6 W and the periodical arrangement length (d) is 1.0 mm, and the analysis range is from 200 MHz to 12 GHz. The first terminal 13 receives the differential signals complementary to each other, the second terminal 14 is the receiver of the differential pair, the third terminal 22 is the near end of the conventional differential pair and the fourth terminal 23 is the remote end of the conventional differential pair. As shown in FIG. 12, the simulation parameters are the same with those of FIG. 11. The S parameter, $S_{dd21}$, stands for the signal transmission ability. The S parameter, $S_{dd41}$, stands for the cross-talk effect between the differential pair with the periodical subwavelength configuration and the conventional differential pair. As shown in FIG. 13, The S parameter, $S_{cd21}$, stands for the mode conversion effect from the differential signal to the common mode signal, and the simulation parameters of FIG. 13 are the same with those of FIG. 12.

In the third embodiment, if both differential pairs are conventional differential pairs, the simulation result can be illustrated by the solid lines of FIG. 12 and FIG. 13. As shown in FIG. 12, when the differential signals are inputted into the first terminal 13 and outputted from the second terminal 14, the transmission ability is expressed by the S parameter, $S_{dd21}$: $S_{dd21}=-0.08821$ dB when the signal frequency is 200 MHz, $S_{dd21}=-2.32492$ dB when the signal frequency is 12 GHz. As shown in FIG. 12, the cross-talk of the conventional differential pair (i.e. differential signals are inputted into the first terminal 13 and outputted from the fourth terminal 23) is expressed by the S parameter, $S_{dd41}$: $S_{dd41}=-48.55245$ dB when the signal frequency is 200 MHz, $S_{dd41}=-9.38157$ dB when the signal frequency is 12 GHz. As shown in FIG. 13, the mode conversion effect between the differential mode to common mode when the differential signals are inputted into the first terminal 13 and outputted from the second terminal 14 is expressed by the S parameter, $S_{cd21}$: $S_{cd21}=-12.37439$ dB when the signal frequency is 12 GHz.

In the third embodiment, the simulation result of the coupling circuit of the conventional differential pair and the differential pair with the slot-type periodical subwavelength configuration can be illustrated by the dashed lines of FIG. 12 and FIG. 13. As shown by the dashed lines of FIG. 12, the transmission ability of the differential signals which are inputted into the first terminal 13 and outputted from the second terminal 14 is expressed by the S parameter, $S_{dd21}$: $S_{dd21}=-0.07265$ dB when the signal frequency is 200 MHz, and $S_{dd21}=-1.14271$ dB when the signal frequency is 12 GHz. As shown in FIG. 12, the cross-talk of the differential signals which are inputted into the first terminal 13 and outputted from the fourth terminal 23 is expressed by the S parameter, $S_{dd41}$: $S_{dd41}=-61.53771$ dB when the signal frequency is 200 MHz, and $S_{dd41}=-36.11641$ dB when the signal frequency is 12 GHz and the maximum of the cross-talk between 1 GHz-10 GHz is $S_{dd41}=-32.2849$ dB when the signal frequency is 5.36 GHz. As shown in FIG. 13, when the differential signals are inputted into the first terminal 13 and outputted from the second terminal 14, the mode conversion effect between the differential mode to the common mode expressed by the S parameter, $S_{cd21}$: $S_{cd21}=-19.69095$ dB when the signal frequency is 12 GHz.

In the third embodiment, the overall comparison results between the conventional differential pair and the differential pair with the slot-type periodical subwavelength configuration are shown in FIG. 12 and FIG. 13. As shown in FIG. 12, the transmission ability of the conventional differential pair is $S_{dd21}=-2.32492$ dB when the signal frequency is 12 GHz; the transmission ability of the differential pair with the periodical subwavelength configuration is $S_{dd21}=-1.14271$ dB when the signal frequency is 12 GHz. The transmission ability is obviously improved at high signal frequency. As shown in FIG. 12, when the signal frequency is 12 GHz, the cross-talk between the two conventional differential pairs is $S_{dd41}=-9.38157$ dB and the cross-talk between the conventional differential pair and the differential pair with the periodical subwavelength configuration is $S_{dd41}=-36.11641$ dB; obviously, the cross-talk is significantly suppressed. As shown in FIG. 13, when the signal frequency is 12 GHz, the mode conversion effect between the conventional differential pairs is $S_{cd21}=-12.37439$ dB and that of the differential pair with the periodical subwavelength configuration is $S_{cd21}=-19.69095$ dB; obviously, the mode conversion effect is significantly decreased. Note FIG. 12 is the S parameter calculation result of the coupling circuit of FIG. 11. Please refer to FIG. 12, $S_{dd21}$ of the conventional differential pair is illustrated by a solid line, which shows its transmission ability is $-0.08821$ dB when the signal frequency is 200 MHz, and is $-2.32492$ dB when the signal frequency is 12 GHz. $S_{dd21}$ of the differential pair with the slot-type periodical subwavelength configuration is illustrated by a dashed line, which shows its transmission ability is $-0.07265$ dB when the signal frequency is 200 MHz, and is $-1.14271$ dB when the signal frequency is 12 GHz. The differential pair with the periodical subwavelength configuration has just a little bit better transmission ability at low frequency. With the increase of the frequency, the differential pair with periodical subwavelength configuration will have better transmission ability and confinement of the electromagnetic field. With the strong confinement of the electromagnetic field, the differential pair with the periodical subwavelength configuration will not result in serious interference to adjacent microstrip lines or conventional differential pair. With the increase of the frequency, the cross-talk will become more obvious. The cross-talk between the conventional differential pairs is $S_{dd41}=-9.38157$ dB when the signal frequency is 12 GHz, and the cross-talk between the conventional differential pair and the differential pair with the periodical subwavelength configuration is $S_{dd41}=-36.11641$ dB when the signal frequency is 12 GHz, which clearly shows that the differential pair with the periodical subwavelength configuration can effectively reduce the cross-talk. FIG. 13 shows the relation between the mode conversion effect and the frequency in the coupling circuit. With the increase of the frequency, the mode conversion effect will become more obvious. However, the differential pair with periodical subwavelength configuration can effectively suppress the mode conversion effect. The mode conversion effect of the conventional differential pair is $S_{cd21}=-12.37439$ dB when the signal frequency is 12 GHz; and the mode conversion effect of the differential pair with the slot-type periodical subwavelength configuration is $S_{cd21}=-19.69095$ dB; therefore, the periodical subwavelength configuration can greatly suppress the mode conversion effect between the differential mode and common mode.

Figure 14:
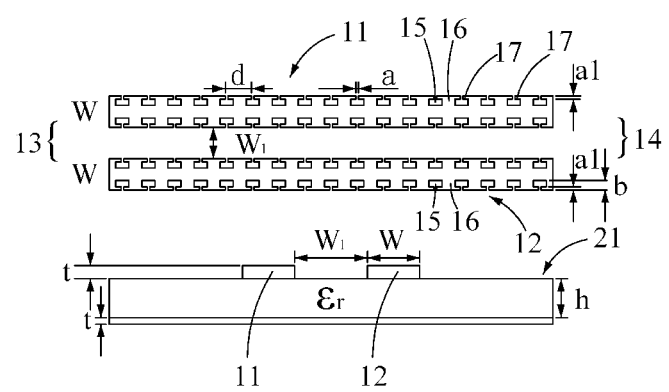
FIG. 14 is a schematic view of a differential pair with double sided opening-type periodical subwavelength configuration in accordance with the present invention.
Figure 15:
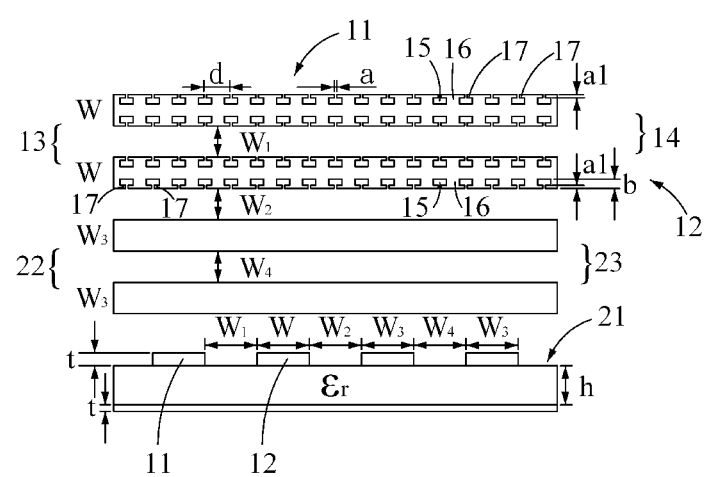
FIG. 15 is a schematic view of a coupling circuit of a conventional differential pair and the differential pair with double sided opening-type periodical subwavelength configuration in accordance with the present invention.

The fourth embodiment of the present invention is, as shown in FIG. 14 and FIG. 15, a differential pair with the double sided opening-type periodical subwavelength configuration. The differential pair is composed of two microstrip lines, the first microstrip line 11 and the second microstrip line 12, with periodical subwavelength configurations. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and each of the rectangular convex bodies comprises two first extended portions 17 parallel extend to centers of the adjacent slots respectively. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the opening of the slots is a, and the dielectric constant of the medium of the substrate 21 is $\in_r$, and the thickness of the first extended portion 17 is $a_1$. If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. The numerical analysis of the coupling circuit configuration shown in FIG. 15 can prove that the differential pair with the periodical subwavelength configuration can dramatically suppress the cross-talk between the adjacent microstrip lines and reduce the mode conversion effect between the differential mode and the common mode.

Figure 16:
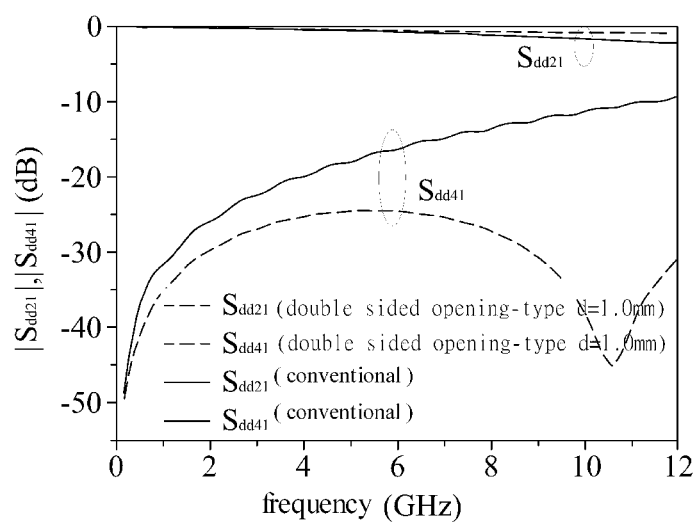
FIG. 16 is a schematic view of the cross-talk between the conventional differential pair and the differential pair with the double sided opening-type periodical subwavelength configuration in accordance with the present invention, where $S_{dd21}$ stands for signal transmission ability, and $S_{dd41}$ stands for cross-talk.
Figure 17:
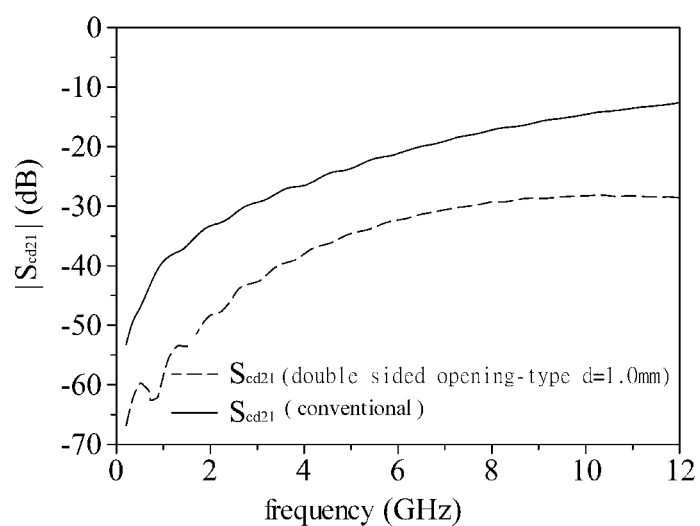
FIG. 17 is a schematic view of the mode conversion effect between differential mode and common mode of the differential pair with double sided opening-type periodical subwavelength configuration in accordance with the present invention, where $S_{cd21}$ stands for mode conversion effect.

FIG. 15 shows a coupling circuit composed of a conventional differential pair and a differential pair with the double sided opening-type periodical subwavelength configurations. $S_{dd21}$ can be obtained by inputting differential signals into the first terminal 13 and analyzing the output signals from the second terminal 14, which clearly shows the transmission ability of the differential pairs. $S_{dd41}$ can be obtained by inputting differential signals into the first terminal 13 and analyzing the output signals from the fourth terminal 23 of the conventional differential pair, which clearly shows the cross-talk of the differential pairs. The distance between the two differential pairs is $W_2$. In FIG. 16, the S parameter, $S_{dd21}$, stands for the transmission ability of differential signals which are inputted into the first terminal 13 and outputted from the second terminal 14. The S parameter, $S_{dd41}$, stands for the generated cross-talk effect when differential signals are inputted into the first terminal 13 and outputted from the fourth terminal 23 of the conventional differential pair. In FIG. 17, the S parameter, $S_{cd21}$, stands for the generated mode conversion effect from the differential mode to common mode when differential signals are inputted into the first terminal 13 and outputted from the second terminal 14. In FIGS. 16, 17, the "conventional" in the figures stands for the transmission and cross-talk effects of the differential pair without the periodical subwavelength configuration, which are illustrated by solid lines. The transmission and cross-talk effects of the differential pair with the periodical subwavelength configuration, or "double sided opening-type", are illustrated by dashed lines. In FIG. 15, the simulation parameters are as follows: $W=W_1=W_2=W_3=W_4=1.2$ mm, the total length of the microstrip line is 10 cm, the material of the substrate 21 is RO4003, the thickness of the metal film (t) is 0.0175 mm, the thickness of the substrate (h) is 0.508 mm, the depth (b) of the slots at both sides is 0.3 W and the periodical arrangement length (d) is 1.0 mm, and the analysis range is from 200 MHz to 12 GHz. As shown in FIG. 15, the first terminal 13 receives the differential signals complementary to each other, the second terminal 14 is the receiver of the differential pair, the third terminal 22 is the near end of the conventional differential pair and the fourth terminal 23 is the remote end of the conventional differential pair. $S_{dd21}$ in FIG. 17 shows the mode conversion effect between the differential signal and the common mode signal.

In the fourth embodiment, if both differential pairs are conventional differential pairs, the simulation result can be illustrated by the solid lines of FIG. 16 and FIG. 17. As shown in FIG. 16, when the differential signals are inputted into the first terminal 13 and outputted from the second terminal 14, the transmission ability is expressed by the S parameter, $S_{dd21}$: $S_{dd21}=-0.08821$ dB when the signal frequency is 200 MHz, $S_{dd21}=-2.32492$ dB when the signal frequency is 12 GHz. As shown in FIG. 16, the cross-talk of the conventional differential pair (i.e. differential signals are inputted into the first terminal 13 and outputted from the fourth terminal 23) is expressed by the S parameter, $S_{dd41}$: $S_{dd41}=-48.55245$ dB when the signal frequency is 200 MHz, $S_{dd41}=-9.38157$ dB when the signal frequency is 12 GHz. As shown in FIG. 17, the mode conversion effect between the differential mode to common mode when the differential signals are inputted into the first terminal 13 and outputted from the second terminal 14 is expressed by the S parameter, $S_{cd21}$: $S_{cd21}=-12.37439$ dB when the signal frequency is 12 GHz.

In the fourth embodiment, the simulation result of the coupling circuit of the conventional differential pair and the differential pair with the double sided opening-type periodical subwavelength configuration can be illustrated by the dashed lines of FIG. 16 and FIG. 17. As shown in FIG. 16, the transmission ability of the differential signals which are inputted into the first terminal 13 and outputted from the second terminal 14 is expressed by the S parameter, and $S_{dd21}$: $S_{dd21}=-0.07977$ dB when the signal frequency is 200 MHz, $S_{dd21}=-1.0001$ dB when the signal frequency is 12 GHz. As shown in FIG. 16, the cross-talk of the differential signals which are inputted into the first terminal 13 and outputted from the fourth terminal 23 is expressed by the S parameter, $S_{dd41}$: $S_{dd41}=-49.2638$ dB when the signal frequency is 200 MHz, $S_{dd41}=-30.72547$ dB when the signal frequency is 12 GHz and the maximum of the cross-talk between 1 GHz-10 GHz is $S_{dd41}=-24.5046$ dB when the signal frequency is 5.26 GHz. As shown in FIG. 17, when the differential signals are inputted into the first terminal 13 and outputted from the second terminal 14, the mode conversion effect between the differential mode to the common mode expressed by the S parameter, $S_{cd21}$: $S_{cd21}=-28.37445$ dB when the signal frequency is 12 GHz.

In the fourth embodiment, the overall comparison results between the conventional differential pair and the differential pair with the double sided opening-type periodical subwavelength configuration are shown in FIG. 16 and FIG. 17. As shown in FIG. 16, the transmission ability of the conventional differential pair is $S_{dd21}$=−2.32492 dB when the signal frequency is 12 GHz; the transmission ability of the differential pair with the periodical subwavelength configuration is $S_{dd21}$=−1.0001 dB when the signal frequency is 12 GHz. The transmission ability is obviously improved at high signal frequency. As shown in FIG. 16, when the signal frequency is 12 GHz, the cross-talk between the two conventional differential pairs is $S_{dd41}$=−9.38157 dB and the cross-talk between the conventional differential pair and the differential pair with the periodical subwavelength configuration is $S_{dd41}$=−30.72547 dB; obviously, the cross-talk is significantly suppressed. As shown in FIG. 17, when the signal frequency is 12 GHz, the mode conversion effect between the conventional differential pairs is $S_{cd21}$=−12.37439 dB and that of the differential pair with the periodical subwavelength configuration is $S_{cd21}$=−28.37445 dB; obviously, the mode conversion effect is significantly decreased. Note: FIG. 16 is the S parameter calculation result of the coupling circuit of FIG. 15. Please refer to FIG. 16, $S_{dd21}$ of the conventional differential pair is illustrated by a solid line, which shows its transmission ability is −0.08821 dB when the signal frequency is 200 MHz, and is −2.32492 dB when the signal frequency is 12 GHz. $S_{dd21}$ of the differential pair with the double sided opening-type periodical subwavelength configuration is illustrated by a dashed line, which shows its transmission ability is −0.07977 dB when the signal frequency is 200 MHz, and is −1.0001 dB when the signal frequency is 12 GHz. Obviously, the differential pair with periodical subwavelength configuration will have better transmission ability and confinement of the electromagnetic field. With the strong confinement of the electromagnetic field, the differential pair with the periodical subwavelength configuration will not result in serious interference to adjacent microstrip lines or conventional differential pair. With the increase of the frequency, the cross-talk will become more obvious. The cross-talk between the conventional differential pairs is $S_{dd41}$=−9.38157 dB when the signal frequency is 12 GHz, and the cross-talk between the conventional differential pair and the differential pair with the double sided opening-type periodical subwavelength configuration is $S_{dd41}$=−30.72547 dB when the signal frequency is 12 GHz, which clearly shows that the differential pair with the double sided opening-type periodical subwavelength configuration can effectively reduce the cross-talk. FIG. 17 shows the relation between the mode conversion effect and the frequency in the coupling circuit. With the increase of the frequency, the mode conversion effect will become more obvious. However, the differential pair with double sided opening-type periodical subwavelength configuration can effectively suppress the mode conversion effect. The mode conversion effect of the conventional differential pair is $S_{cd21}$=−12.37439 dB when the signal frequency is 12 GHz; and the mode conversion effect of the differential pair with the double sided opening-type periodical subwavelength configuration is $S_{cd21}$=−28.37445 dB; therefore, the periodical subwavelength configuration can greatly suppress the mode conversion effect between the differential mode and common mode.

Figure 18:
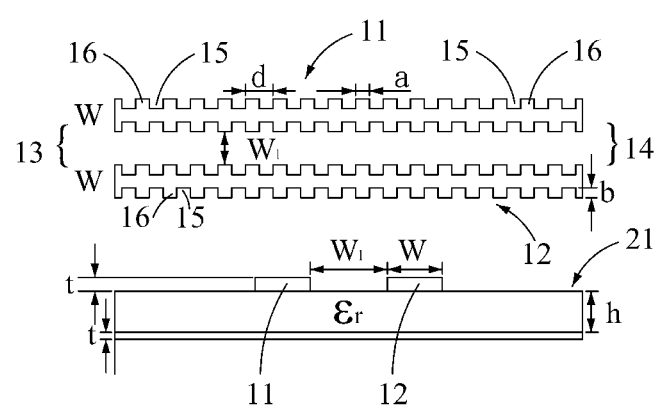
FIG. 18 is a schematic view of a differential pair with double sided slot-type periodical subwavelength configuration in accordance with the present invention.
Figure 19:
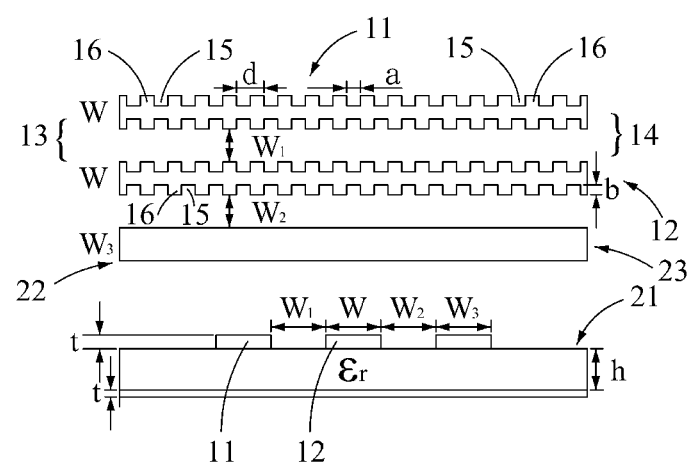
FIG. 19 is a schematic view of a coupling circuit of a single-ended microstrip line and the differential pair with double sided slot-type periodical subwavelength configuration in accordance with the present invention.
Figure 20:
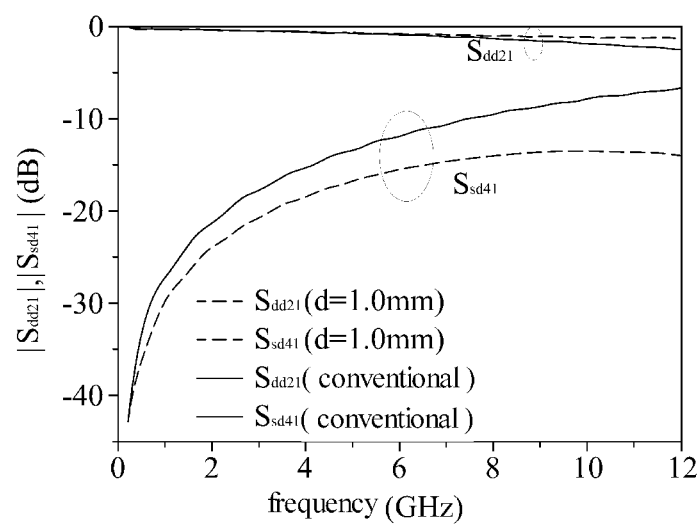
FIG. 20 is a schematic view of the cross-talk between the single-ended microstrip line and the differential pair with the double sided slot-type periodical subwavelength configuration in accordance with the present invention, where $S_{dd21}$ stands for signal transmission ability, and $S_{dd41}$ stands for cross-talk.
Figure 21:
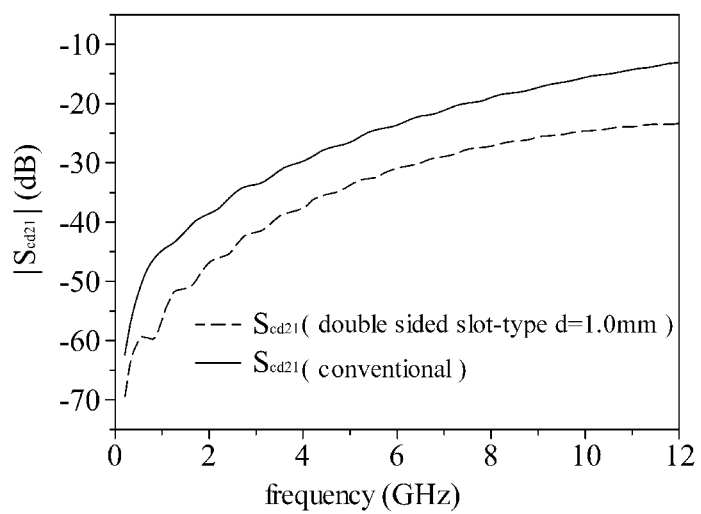
FIG. 21 is a schematic view of the mode conversion effect between differential mode and common mode of the differential pair with double sided slot-type periodical subwavelength configuration in accordance with the present invention, where $S_{cd21}$ stands for mode conversion effect.

The fifth embodiment of the present invention is, as shown in FIG. 18, a differential pair with the double sided slot-type periodical subwavelength configuration. The differential pair is composed of two microstrip lines, the first microstrip line 11 and the second microstrip line 12, with periodical subwavelength configurations. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and the interval of two adjacent rectangular convex bodies 16 is the periodical arrangement length of these slots. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, and the dielectric constant of the medium of the substrate 21 is $\in_r$ and the width of the slots is a. If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. The numerical analysis of the coupling circuit configuration shown in FIG. 19 can prove that the differential pair with the periodical subwavelength configuration can dramatically suppress the cross-talk between adjacent microstrip lines and reduce the mode conversion effect between the differential mode and common mode. FIG. 19 shows a coupling circuit composed of a differential pair with the double sided slot-type periodical subwavelength configurations and a single-ended microstrip line; the differential pair is composed of two microstrip lines, the first microstrip line 11 and the second microstrip line 12; the configuration of the slots comprises a plurality of rectangular convex bodies 16 continuously and periodically combined with a plurality of rectangular concave bodies 15, and the two adjacent rectangular convex bodies 16 are divided by one rectangular concave body 15; in FIG. 19, the width of the two microstrip lines is W, the distance between the two microstrip lines is $W_1$, the distance between the two differential pairs is $W_2$, the thickness of the metal film is t, the thickness of the substrate 21 is h, the periodical arrangement length of the two microstrip lines is d, the depth of the slots is b, the width of the rectangular concave bodies 15 is a, and the dielectric constant of the medium of the substrate 21 is $\in_r$. The first terminal 13 receives the differential signals complementary to each other, the second terminal 14 is the receiver of the differential pair, the third terminal 22 is the near end of the conventional differential pair and the fourth terminal 23 is the remote end of the conventional differential pair. $S_{dd21}$ can be obtained by inputting differential signals into the first terminal 13 and analyzing the output signals from the second terminal 14, which clearly shows the transmission ability of the differential pairs. Inputting differential signals into the first terminal 13 and analyzing the output signals from the fourth terminal 23 of the conventional differential pair can obtain the cross-talk of the differential pair and adjacent single-ended microstrip line. As shown in FIG. 19, the distance between the two differential pairs is $W_2$. The S parameter, $S_{dd21}$, stands for the transmission ability of differential signals which are inputted into the first terminal 13 and outputted from the second terminal 14. In FIG. 20, the S parameter, $S_{dd41}$, stands for the generated cross-talk effect when differential signals are inputted into the first terminal 13 and outputted from the fourth terminal 23 of the conventional differential pair. In FIG. 21, the S parameter, $S_{cd21}$, stands for the generated mode conversion effect from the differential mode to common mode when differential signals are inputted into the first terminal 13 and outputted from the second terminal 14. In FIGS. 20, 21, the "conventional" in the figures stands for the transmission and cross-talk effects of the differential pair without the periodical subwavelength configuration, which are illustrated by solid lines. The transmission and cross-talk effects of the differential pair with the periodical subwavelength configuration, or "double sided slot-type", are illustrated by dashed lines. The simulation parameters are shown in FIG. 19 as follows: $W=W_1=W_2=W_3=1.2$ mm, the total length of the microstrip line is 10 cm, the material of the substrate 21 is RO4003, the thickness of the metal film (t) is 0.0175 mm, the thickness of the substrate (h) is 0.508 mm, the depth (b) of the slots is 0.3 W and the periodical arrangement length (d) is 1.0 mm, and the analysis range is from 200 MHz to 12 GHz. The first terminal 13 receives the differential signals complementary to each other, the second terminal 14 is the receiver of the differential pair, the third terminal 22 is the near end of the conventional differential pair and the fourth terminal 23 is the remote end of the conventional differential pair. As shown in FIG. 20, the simulation parameters are the same with those of FIG. 19. $S_{dd21}$ stands for signal transmission ability and $S_{dd41}$ stands for the cross-talk between the differential pair and the adjacent single-ended microstrip line. As shown in FIG. 21, $S_{cd21}$ stands for the mode conversion effect from the differential signal to the common mode signal, and the simulation parameters of FIG. 21 are the same with those of FIG. 20.

In the fifth embodiment, the simulation result of the coupling circuit of the conventional differential pair and the single-ended microstrip line can be illustrated by the solid lines of FIG. 20 and FIG. 21. As shown in FIG. 20, when the differential signals are inputted into the first terminal 13 and outputted from the second terminal 14, the transmission ability is expressed by the S parameter, $S_{dd21}$: $S_{dd21}=-0.0679$ dB when the signal frequency is 200 MHz, $S_{dd21}=-2.36253$ dB when the signal frequency is 12 GHz. As shown in FIG. 20, the cross-talk of the conventional differential pair (i.e. differential signals are inputted into the first terminal 13 and outputted from the fourth terminal 23 of the conventional differential pair) is expressed by the S parameter, $S_{sd41}$: $S_{sd41}=-42.63854$ dB when the signal frequency is 200 MHz, $S_{dd41}=-6.55742$ dB when the signal frequency is 12 GHz. As shown in FIG. 21, when the differential signals are inputted into the first terminal 13 and outputted from the second terminal 14, the mode conversion effect between the differential mode to the common mode is expressed by the S parameter, $S_{cd21}$: $S_{cd21}=-12.96263$ dB when the signal frequency is 12 GHz.

In the fifth embodiment, the simulation result of the coupling circuit of the conventional differential pair and the single-ended microstrip line can be illustrated by the dashed lines of FIG. 20 and FIG. 21. As shown in FIG. 20, the transmission ability of differential signals which are inputted into the first terminal 13 and outputted from the second terminal 14 is expressed by the S parameter, $S_{dd21}$, $S_{dd21}=-0.10201$ dB when the signal frequency is 200 MHz, and $S_{dd21}=-1.18541$ dB when the signal frequency is 12 GHz. As shown in FIG. 20, the cross-talk of the differential signals which are inputted into the first terminal 13 and outputted from the fourth terminal 23 is expressed by the S parameter, $S_{sd41}$: $S_{sd41}=-42.82679$ dB when the signal frequency is 200 MHz, and $S_{sd41}=-13.93195$ dB when the signal frequency is 12 GHz. As shown in FIG. 21, when the differential signals are inputted into the first terminal 13 and outputted from the second terminal 14, the mode conversion effect between the differential mode to the common mode is expressed by the S parameter, $S_{cd21}$: $S_{cd21}=-23.28997$ dB when the signal frequency is 12 GHz.

In the fifth embodiment, the overall comparison results between the conventional differential pair and the differential pair with the double sided slot-type periodical subwavelength configuration are shown in FIG. 20 and FIG. 21. As shown in FIG. 20, the transmission ability of the conventional differential pair is $S_{dd21}=-2.36253$ dB when the signal frequency is 12 GHz; the transmission ability of the differential pair with the periodical subwavelength configuration is $S_{dd21}=-1.18541$ dB when the signal frequency is 12 GHz. The transmission ability is obviously improved at high signal frequency. As shown in FIG. 20, when the signal frequency is 12 GHz, the cross-talk between the conventional differential pair and the single-ended microstrip line is $S_{sd41}=-6.55742$ dB and the cross-talk between the conventional differential pair and the differential pair with the periodical subwavelength configuration is $S_{sd41}=-13.93195$ dB; obviously, the cross-talk is significantly suppressed. As shown in FIG. 21, when the signal frequency is 12 GHz, the mode conversion effect of the conventional differential pair is $S_{cd21}=-12.96263$ dB and that of the differential pair with the periodical subwavelength configuration is $S_{cd21}=-23.28997$ dB; obviously, the mode conversion effect is significantly decreased. Note: FIG. 20 is the S parameter calculation result of the coupling circuit of FIG. 19. Please refer to FIG. 20, $S_{dd21}$ of the conventional differential pair is illustrated by a solid line, which shows its transmission ability is $-0.0679$ dB when the signal frequency is 200 MHz, and is $-2.36253$ dB when the signal frequency is 12 GHz. $S_{dd21}$ of the differential pair with the double sided slot-type periodical subwavelength configuration is illustrated by a dashed line, which shows its transmission ability is $-0.10201$ dB when the signal frequency is 200 MHz, and is $-1.18541$ dB when the signal frequency is 12 GHz. Obviously, the conventional differential pair has a little bit better transmission ability. With the increase of the frequency, the differential pair with the periodical subwavelength configuration will have better transmission ability and confinement of the electromagnetic field. With the strong confinement of the electromagnetic field, the differential pair with the double sided slot-type periodical subwavelength configuration will not result in serious interference to adjacent microstrip lines. With the increase of the frequency, the cross-talk will become more obvious. The cross-talk between the conventional differential pair and the single-ended microstrip line is $S_{sd41}=-6.55742$ dB when the signal frequency is 12 GHz, and the cross-talk between the differential pair with the double sided slot-type periodical subwavelength configuration and the single-ended microstrip line is $S_{sd41}=-13.93195$ dB when the signal frequency is 12 GHz, which clearly shows that the differential pair with the double sided slot-type periodical subwavelength configuration can effectively reduce the cross-talk. The mode conversion effect of the conventional differential pair is $S_{cd21}=-12.96263$ dB when the signal frequency is 12 GHz; and the mode conversion effect of the differential pair with the double sided slot-type periodical subwavelength configuration is $S_{cd21}=-23.28997$ dB; therefore, the periodical subwavelength configuration can greatly suppress the mode conversion effect between the differential mode and common mode.

Figure 22:
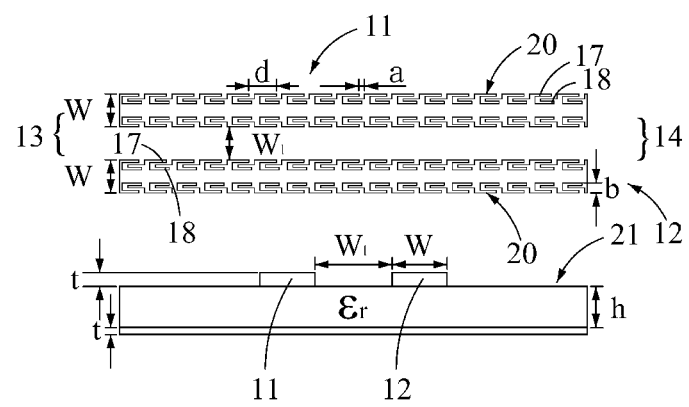
FIG. 22 is a schematic view of a differential pair with double sided hairpin-type periodical subwavelength configuration in accordance with the present invention.
Figure 23:
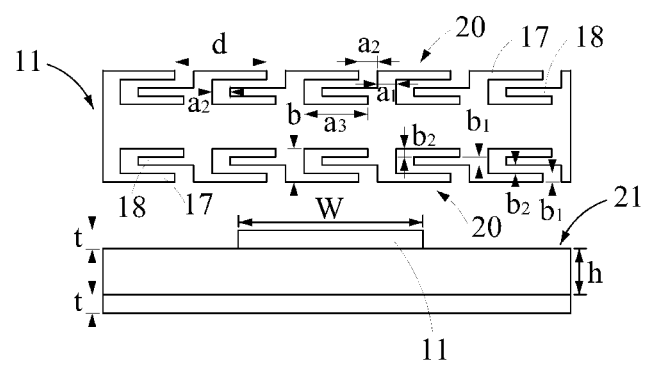
FIG. 23 is a schematic view of the detailed structure of the differential pair with double sided hairpin-type periodical subwavelength configuration in accordance with the present invention.
Figure 24:
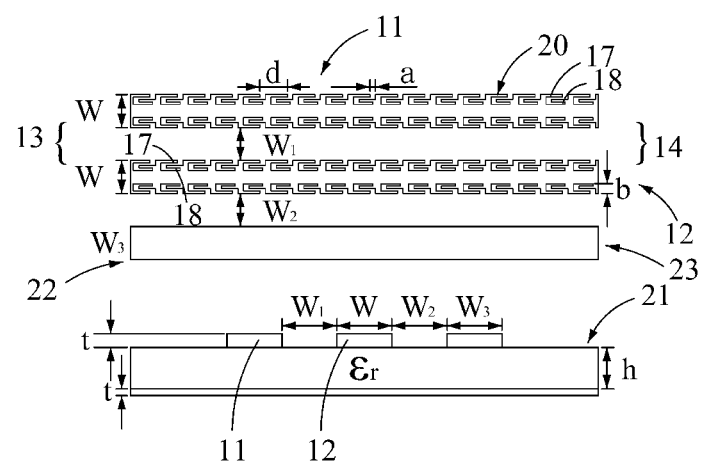
FIG. 24 is a schematic view of a coupling circuit of a single-ended microstrip line and the differential pair with double sided hairpin-type periodical subwavelength configuration in accordance with the present invention.
Figure 25:
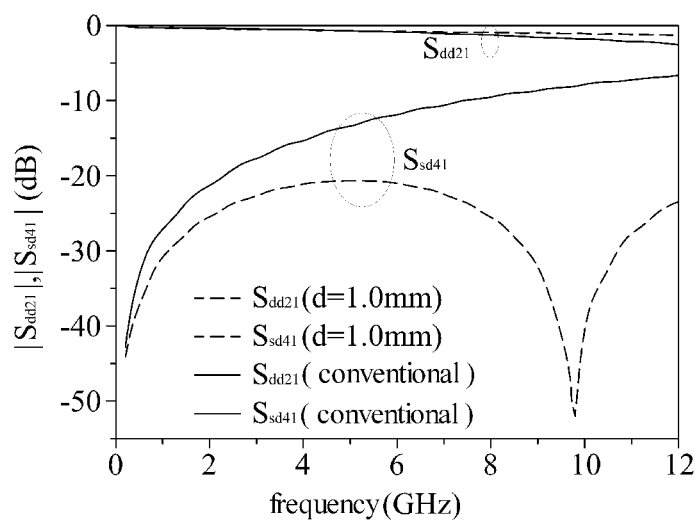
FIG. 25 is a schematic view of the cross-talk between the single-ended microstrip line and the differential pair with the double sided hairpin-type periodical subwavelength configuration in accordance with the present invention, where $S_{dd21}$ stands for signal transmission ability, and $S_{dd41}$ stands for cross-talk.
Figure 26:
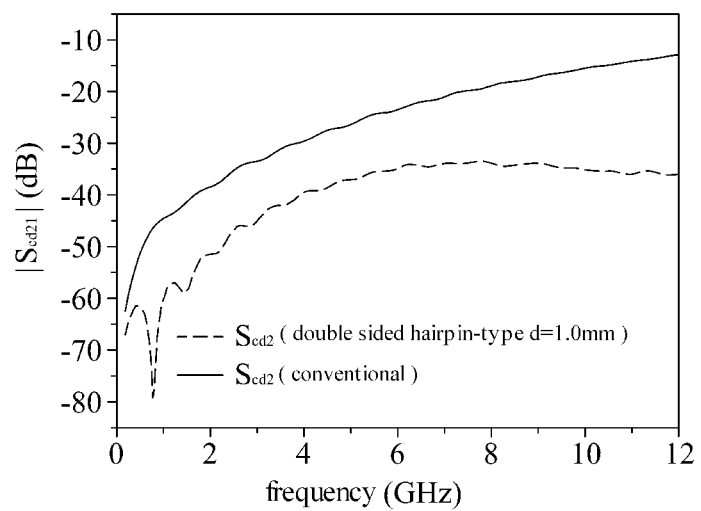
FIG. 26 is a schematic view of the mode conversion effect between differential mode and common mode of the differential pair with double sided hairpin-type periodical subwavelength configuration in accordance with the present invention, where $S_{cd21}$ stands for mode conversion effect.

The sixth embodiment of the present invention is, as shown in FIG. 22 and FIG. 23, a differential pair with the double sided hairpin-type periodical subwavelength configuration. As shown in FIG. 22, the differential pair is composed of two microstrip lines, the first microstrip line 11 and the second microstrip line 12 (FIG. 22), with the periodical subwavelength configuration. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of Z-shaped convex bodies 20 arranged continuously and periodically, and each of the Z-shaped convex bodies 20 comprises two extended portions 17, 18, wherein the first extended portion 17 parallel extends from the opening of one slot to the center of the adjacent slot; and the second extended portion 18 parallel extends from the middle of the Z-shaped convex body 20 to the center of another adjacent slot. The direction where the first extended portion 17 extends is inverse to the direction where the second extended portion 18 extends. As shown in FIG. 22, the width of the two microstrip lines is W, the distance between the two microstrip lines is $W_1$ (FIG. 22), the thickness of the metal film is $t$, the thickness of the substrate 21 is h, the periodical arrangement length of the two microstrip lines is d, the depth of the slots is b, the width of the opening of the slots is a (FIG. 22), and the dielectric constant of the medium of the substrate 21 is $\in_r$ (FIG. 22). As shown in FIG. 23, there are still other structure parameters, such as $a_1$, $a_2$ (the widths of the outer openings), $a_3$ (the width of the inner openings), $b_1$ (the width of the thin metal bars) and $b_2$ (the interval of the thin metal bars). If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. The numerical analysis of the coupling circuit configuration shown in FIG. 24 can prove the differential pair with the double sided hairpin-type periodical subwavelength configuration can dramatically suppress the cross-talk between the adjacent microstrip lines and reduce the mode conversion effect between the differential mode and common mode. FIG. 24 shows a coupling circuit composed of a differential pair with double sided hairpin-type periodical subwavelength configuration and a single-ended microstrip line; the differential pair is composed of two microstrip lines, the first microstrip line 11 and the second microstrip line 12; the configuration of the slots comprises a plurality of Z-shaped convex bodies 20 arranged continuously and periodically, and each of the Z-shaped convex bodies 20 comprises two extended portions 17, 18, wherein the first extended portion 17 parallel extends from the opening of one slot to the center of the adjacent slot; and the second extended portion 18 parallel extends from the middle of the Z-shaped convex body 20 to the center of another adjacent slot; In FIG. 24, the width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the opening of the slots is a, and the dielectric constant of the medium of the substrate 21 is $\in_r$. $S_{dd21}$ can be obtained by inputting differential signals into the first terminal 13 and analyzing the output signals from the second terminal 14, which clearly shows the transmission ability of the differential pairs. The cross-talk between the differential pair and the single-ended microstrip line can be acquired by analyzing the outputs from the fourth terminal 23. The distance between the two differential pairs is $W_2$. In FIG. 25, the S parameter, $S_{dd21}$, stands for the transmission ability of the differential signals which are inputted into the first terminal 13 and outputted from the second terminal 14. The S parameter, $S_{dd41}$, stands for the generated cross-talk effect when differential signals are inputted into the first terminal 13 and outputted from the fourth terminal 23 of the single-ended microstrip line. In FIG. 26, the S parameter, $S_{cd21}$, stands for the generated mode conversion effect from the differential mode to common mode when differential signals are inputted into the first terminal 13 and outputted from the second terminal 14. In FIGS. 25, 26, the "conventional" in the figures stands for the transmission and cross-talk effects of the differential pair without the periodical subwavelength configuration, which are illustrated by solid lines. The transmission and cross-talk effects of the differential pair with the periodical subwavelength configuration, or "double sided hairpin type", are illustrated by dashed lines. The simulation parameters are shown in FIG. 24 as follows: $W=W_1=W_2=W_3=1.2$ mm, the total length of the microstrip line is 10 cm, the material of the substrate 21 is RO4003, the thickness of the metal film (t) is 0.0175 mm, the thickness of the substrate (h) is 0.508 mm, the depth of the slot (b) is 0.3 W and the periodical arrangement length (d) is 1.0 mm, and the analysis range is from 200 MHz to 12 GHz. In FIG. 24, the first terminal 13 receives the differential signals complementary to each other, the second terminal 14 is the receiver of the differential pair, the third terminal 22 is the near end of the conventional differential pair and the fourth terminal 23 is the remote end of the conventional differential pair. The simulation parameters of FIG. 25 are the same with those of FIG. 24. The S parameter, $S_{dd21}$, stands for the signal transmission ability. The S parameter, $S_{dd41}$, stands for the cross-talk effect between the differential pair with the periodical subwavelength configuration and the single-ended microstrip line. Other parameters are as follows: $a_1=0.1d$, $a_2=0.2d$, $a_3=0.7d$, $b_1=b_2=0.25b$. The simulation parameters of FIG. 26 are the same with those of FIG. 24. The S parameter, $S_{cd21}$, stands for the mode conversion effect from the differential signal to the common mode signal.

In the sixth embodiment, the simulation result of the coupling circuit of the conventional differential pair and the single-ended microstrip line can be illustrated by the solid lines of FIG. 25 and FIG. 26. As shown in FIG. 25, when the differential signals are inputted into the first terminal 13 and outputted from the second terminal 14, the transmission ability is expressed by the S parameter, $S_{dd21}$: $S_{dd21}=-0.0679$ dB when the signal frequency is 200 MHz, $S_{dd21}=-2.36253$ dB when the signal frequency is 12 GHz. As shown in FIG. 25, the cross-talk of the conventional differential pair (i.e. differential signals are inputted into the first terminal 13 and outputted from the fourth terminal 23) is expressed by the S parameter, $S_{dd41}$: $S_{sd41}=-42.63854$ dB when the signal frequency is 200 MHz, $S_{sd41}=-6.55742$ dB when the signal frequency is 12 GHz. As shown in FIG. 26, when the differential signals are inputted into the first terminal 13 and outputted from the second terminal 14, the mode conversion effect between the differential mode to the common mode is expressed by the S parameter, $S_{cd21}$: $S_{cd21}$=−12.96263 dB when the signal frequency is 12 GHz.

In the sixth embodiment, the simulation result of the coupling circuit of the differential pair with the double sided hairpin-type periodical subwavelength configuration and the single-ended microstrip line can be illustrated by the dashed lines of FIG. 25 and FIG. 26. As shown in FIG. 25, the transmission ability that of differential signals which are inputted into the first terminal 13 and outputted from the second terminal 14 is expressed by the S parameter, $S_{dd21}$: $S_{dd21}$=−0.11412 dB when the signal frequency is 200 MHz, and $S_{dd21}$=−1.1716 dB when the signal frequency is 12 GHz. As shown in FIG. 25, the cross-talk of differential signals which are inputted into the first terminal 13 and outputted from the fourth terminal 23 is expressed by the S parameter, $S_{sd41}$: $S_{sd41}$=−43.8893 dB when the signal frequency is 200 MHz, and $S_{sd41}$=−23.45903 dB when the signal frequency is 12 GHz. As shown in FIG. 26, when the differential signals are inputted into the first terminal 13 and outputted from the second terminal 14, the mode conversion effect between the differential mode to the common mode is expressed by the S parameter, $S_{cd21}$: $S_{cd21}$=−36.05781 dB when the signal frequency is 12 GHz.

In the sixth embodiment, the overall comparison results between the conventional differential pair and the differential pair with the double sided hairpin-type periodical subwavelength configuration are shown in FIG. 25 and FIG. 26. As shown in FIG. 25, the transmission ability of the conventional differential pair is $S_{dd21}$=−2.36253 dB when the signal frequency is 12 GHz; the transmission ability of the differential pair with the periodical subwavelength configuration is $S_{dd21}$=−1.1716 dB when the signal frequency is 12 GHz. The transmission ability is obviously improved at high signal frequency. As shown in FIG. 25, when the signal frequency is 12 GHz, the cross-talk between the conventional differential pair and the single-ended microstrip line is $S_{sd41}$=−6.55742 dB and the cross-talk between the single-ended microstrip line and the differential pair with the periodical subwavelength configuration is $S_{sd41}$=−23.45903 dB; obviously, the cross-talk is significantly suppressed. As shown in FIG. 26, when the signal frequency is 12 GHz, the mode conversion effect of the conventional differential pair is $S_{cd21}$=−12.96263 dB and that of the differential pair with the periodical subwavelength configuration is $S_{cd21}$=−36.05781 dB; obviously, the mode conversion effect is significantly decreased. Note: FIG. 25 is the S parameter calculation result of the coupling circuit of FIG. 24. Please refer to FIG. 25, $S_{dd21}$ of the conventional differential pair is illustrated by a solid line, which shows its transmission ability is −0.0679 dB when the signal frequency is 200 MHz, and is −2.36253 dB when the signal frequency is 12 GHz. $S_{dd21}$ of the differential pair with the double sided hairpin-type periodical subwavelength configuration is illustrated by a dashed line, which shows its transmission ability is −0.11412 dB when the signal frequency is 200 MHz, and is −1.1716 dB when the signal frequency is 12 GHz. The conventional differential pair has a little bit better transmission ability at low frequency. With the increase of the frequency, the differential pair with periodical subwavelength configuration will have better transmission ability and confinement of the electromagnetic field. With the strong confinement of the electromagnetic field, the differential pair with the double sided hairpin-type periodical subwavelength configuration will not result in serious interference to adjacent microstrip lines. With the increase of the frequency, the cross-talk will become more obvious. The cross-talk between the conventional differential pair and the single-ended microstrip line is $S_{sd41}$=−6.55742 dB when the signal frequency is 12 GHz; however, the cross-talk between the differential pair with the double sided hairpin-type periodical subwavelength configuration and the single-ended microstrip line is $S_{sd41}$=−23.45903 dB when the signal frequency is 12 GHz, which effectively represses the cross-talk. FIG. 26 shows the relation between the mode conversion effect and the frequency. With the increase of the frequency, the mode conversion effect will become more obvious. However, the differential pair with double sided hairpin-type periodical subwavelength configuration can effectively suppress the mode conversion effect. The mode conversion effect of the conventional differential pair is $S_{cd21}$=−12.96263 dB when the signal frequency is 12 GHz; and the mode conversion effect of the differential pair with the double sided hairpin-type periodical subwavelength configuration is $S_{cd21}$=−36.05781 dB; therefore, the periodical subwavelength configuration can greatly suppress the mode conversion effect between the differential mode and common mode.

One of the primary objects of the present invention is to provide low cross-talk differential microstrip lines for high-frequency signal transmission, such like the fourth embodiment, the fifth embodiment and the sixth embodiment. These slots are periodically arranged to form a subwavelength configuration, such as FIG. 14, FIG. 18 and FIG. 22. The present invention further comprises a plurality of slots periodically arranged along the inner side of the first microstrip line 11 opposite the outer side of the first microstrip line 11; and a plurality of slots periodically arranged along the inner side of the second microstrip line 12 opposite the outer side of the second microstrip line 12, wherein the distance between the inner side of the first microstrip line 11 and the inner side of the second microstrip line 12 is as shown in FIG. 14, FIG. 18 and FIG. 22. Thus, in the fourth embodiment, the fifth embodiment and the sixth embodiment, these slots along the edges of the both sides of the first microstrip line 11 and the second microstrip line 12 are arranged to form the periodical subwavelength configuration.

Figure 27:
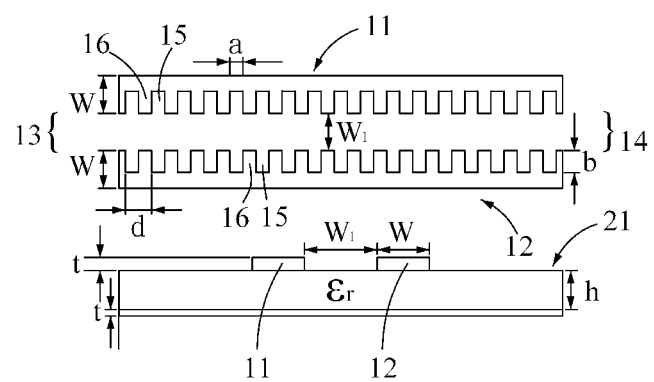
FIG. 27 is a schematic view of a differential pair with slot-type periodical subwavelength configuration in accordance with the present invention.

The Seventh embodiment of the present invention is, as shown in FIG. 27, a differential pair with the slot-type periodical subwavelength configuration, wherein the slots are periodically arranged along the inner sides of the first microstrip line and the second microstrip line to form the subwavelength configuration. The differential pair is composed of two microstrip lines, the first microstrip line 11 and the second microstrip line 12, with the slot-type periodical subwavelength configuration. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and the interval of the two adjacent rectangular convex bodies 16 is the periodical arrangement length of these slots. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the rectangular concave bodies 15 is a, and the dielectric constant of the medium of the substrate 21 is $\in_r$. If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. Similarly, as the previous embodiments, the differential pair with the slot-type periodical subwavelength configuration of the embodiment can also effectively reduce both of the mode conversion effect and the cross-talk, whereby the above problems can be solved.

Figure 28:
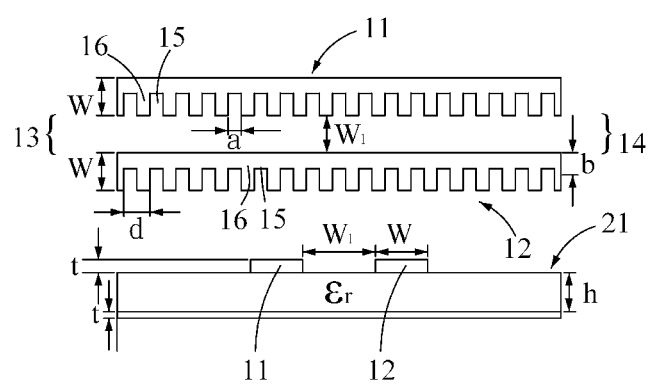
FIG. 28 is a schematic view of a differential pair with slot-type periodical subwavelength configuration in accordance with the present invention.

The eighth embodiment of the present invention is, as shown in FIG. 28, a differential pair with the slot-type periodical subwavelength configuration, wherein the slots are periodically arranged along the inner side of the first microstrip line and the outer side of the second microstrip line to form the subwavelength configuration. The differential pair is composed of two microstrip lines, the first microstrip line 11 and the second microstrip line 12, with the slot-type periodical subwavelength configuration. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and the interval of the two adjacent rectangular convex bodies 16 is the periodical arrangement length of these slots. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the rectangular concave bodies 15 is a, and the dielectric constant of the medium of the substrate 21 is $\in_r$. If there is a single-ended microstrip line or another differential pair beside the conventional differential pair without slots, two obvious phenomena will take place. The first phenomenon is that an obvious mode conversion effect between the differential mode and the common mode will occur between the first terminal 13 and the second terminal 14. The second phenomenon is that the complementary signals inputted into the first terminal 13 will bring about cross-talk to the adjacent microstrip lines or the differential pairs. Similarly, as the previous embodiments, the differential pair with the slot-type periodical subwavelength configuration of the embodiment can also effectively reduce both of the mode conversion effect and the cross-talk, whereby the above problems can be solved.

Figure 29:
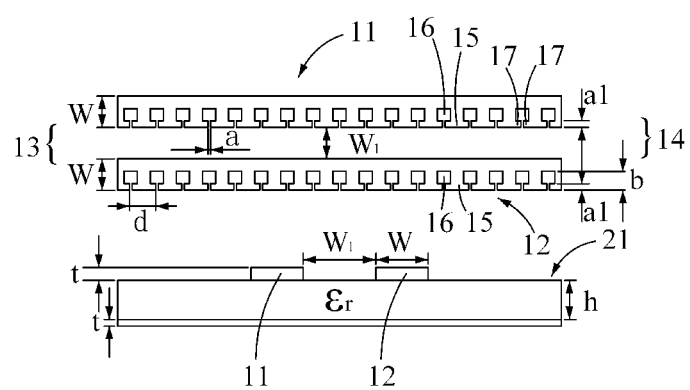
FIG. 29 is a schematic view of a differential pair with opening-type periodical subwavelength configuration in accordance with the present invention.

The ninth embodiment of the present invention is, as shown in FIG. 29, a differential pair of microstrip lines with the opening-type periodical subwavelength configuration, wherein the slots are periodically arranged along the inner side of the first microstrip line and the outer side of the second microstrip line to form the subwavelength configuration. The differential pair is composed of two microstrip lines, the first microstrip line 11 and the second microstrip line 12, with periodical subwavelength configurations. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 15 continuously and periodically combined with a plurality of rectangular concave bodies 16. Two adjacent rectangular convex bodies 15 are divided by one rectangular concave body 16, and each of the rectangular convex bodies 15 comprises two first extended portions 17 parallel extend to centers of the adjacent slots respectively. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the openings of the rectangular concave bodies 16 is a, the thickness of the first extended portion 17 is $a_1$, and the dielectric constant of the medium of the substrate 21 is $\in_r$. If there is a single-ended microstrip line or another differential pair beside the conventional differential pair without slots, two obvious phenomena will take place. The first phenomenon is that an obvious mode conversion effect between the differential mode and common mode will occur between the first terminal 13 and the second terminal 14. The second phenomenon is that the complementary signals inputted into the first terminal 13 will bring about cross-talk to the adjacent microstrip lines or differential pairs. Similarly, as the previous embodiments, the differential pair with the opening-type periodical subwavelength configuration of the embodiment can also effectively reduce both of the mode conversion effect and the cross-talk, whereby the above problems can be solved.

Figure 30:
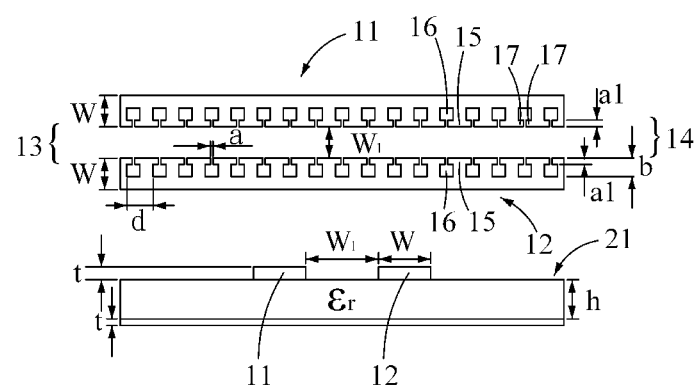
FIG. 30 is a schematic view of a differential pair with opening-type periodical subwavelength configuration in accordance with the present invention.

The tenth embodiment of the present invention is, as shown in FIG. 30, a differential pair of microstrip lines with the opening-type periodical subwavelength configuration, wherein the slots are periodically arranged along the inner sides of the first microstrip line and the second microstrip line to form the subwavelength configuration. The differential pair is composed of two microstrip lines, the first microstrip line 11 and the second microstrip line 12, with periodical subwavelength configurations. The signals are inputted into the first terminal 13 and outputted from the second terminal 14. The signal transmitted via the first microstrip line 11 has a 180° phase difference from the signal transmitted via the second microstrip line 12 (i.e.: the signal transmitted via the first microstrip line 11 is the complementary signal of that transmitted via the second microstrip line 12.). The configuration of the slots comprises a plurality of rectangular convex bodies 15 continuously and periodically combined with a plurality of rectangular concave bodies 16. Two adjacent rectangular convex bodies 15 are divided by one rectangular concave body 16, and each of the rectangular convex bodies 15 comprises two first extended portions 17 parallel extend to centers of the adjacent slots respectively. The width of the two microstrip lines is W, the distance between the two microstrip lines is $W_1$, the thickness of the metal film is t, the thickness of the substrate 21 is h, the periodical arrangement length of the two microstrip lines is d, the depth of the slots is b, the width of the openings of the rectangular concave bodies 16 is a, the thickness of the first extended portion 17 is $a_1$, and the dielectric constant of the medium of the substrate 21 is $\in_r$. If there is a single-ended microstrip line or another differential pair beside the conventional differential pair without slots, two obvious phenomena will take place. The first phenomenon is that an obvious mode conversion effect between the differential mode and common mode will occur between the first terminal 13 and the second terminal 14. The second phenomenon is that the complementary signals inputted into the first terminal 13 will bring about cross-talk to the adjacent microstrip lines or differential pairs. Similarly, as the previous embodiments, the differential pair with the opening-type periodical subwavelength configuration of the embodiment can also effectively reduce both of the mode conversion effect and the cross-talk, whereby the above problems can be solved.

One of the primary objects of the present invention is, as shown in FIG. 10 and FIG. 18, to provide a differential pair with slot-type periodical subwavelength configuration, such like the third embodiment and the fifth embodiment. The configuration of the slots comprises a plurality of rectangular convex bodies 16 continuously and periodically combined with a plurality of rectangular concave bodies 15, and the two adjacent rectangular convex bodies 16 are divided by one rectangular concave body 15, and the interval of the two adjacent rectangular convex bodies 16 is the periodical arrangement length of these slots.

One of the primary objects of the present invention is, as shown in FIG. 1 and FIG. 14, to provide a differential pair with opening-type periodical subwavelength configuration, such like the first embodiment and the fourth embodiment. The configuration of the slots in these embodiments comprises a plurality of rectangular convex bodies 16 continuously and periodically combined with a plurality of rectangular concave bodies 15, and the two adjacent rectangular convex bodies 16 are divided by one rectangular concave body 15, and each of the rectangular convex bodies 16 comprises two first extended portions 17 parallel extend to centers of the adjacent slots respectively.

One of the primary objects of the present invention is, as shown in FIG. 5 and FIG. 22, to provide a differential pair with hairpin-type periodical subwavelength configuration, such like the second embodiment and the sixth embodiment. The configuration of the slots in these embodiments comprises a plurality of Z-shaped convex bodies 20 arranged periodically and continuously, and each of the Z-shaped convex bodies comprises two extended portions 17, 18. The first extended portion 17 parallel extends from the opening of one slot to the center of the adjacent slot. The second extended portion 18 parallel extends from the middle of the Z-shaped convex body to the center of another adjacent slot. In particular, the direction where the first extended portion 17 extends is inverse to the direction where the second extended portion 18 extends.

While the means of specific embodiments in present invention has been described by reference drawings, numerous modifications and variations could be made thereto by those skilled in the art without departing from the scope and spirit of the invention set forth in the claims. The modifications and variations should be limited by the specification of the present invention in a range.

What is claimed is:

1. A pair of differential microstrip lines, comprising:
   a first microstrip line, for transmitting a first transmission signal, and the first microstrip line having a first subwavelength configuration configured by a plurality of slots arranged periodically therein;
   a second microstrip line, for transmitting a second transmission signal, wherein the second microstrip is parallel to the first microstrip line and has a second subwavelength configuration configured by a plurality of slots arranged periodically therein, and the second transmission signal is a complementary signal of the first transmission signal and has a 180° phase difference from the first transmission signal;
   a first terminal, for respectively receiving complementary signals and transmitting the complementary signals to the first microstrip line and the second microstrip line; and
   a second terminal, for respectively outputting the complementary signals received from the first microstrip line and the second microstrip line;
   wherein the plurality of slots of the first subwavelength configuration are periodically arranged along at least one side of the first microstrip line and the plurality of slots of the second subwavelength configuration are periodically arranged along at least one side of the second microstrip line, and periodical arrangement length of the plurality of slots is shorter than wavelengths of the first and the second transmission signals, whereby the first and the second subwavelength configurations provide confinement of electromagnetic field, and reduce a mode conversion effect between a differential signal and a common mode signal when the complementary signals are transmitted from the first terminal to the second terminal.

2. The differential microstrip lines of claim 1, wherein the first subwavelength configuration configured by the plurality of slots are arranged along an inner side of the first microstrip line and the second subwavelength configuration configured by the plurality of slots are arranged along an inner side of the second microstrip line.

3. The differential microstrip lines of claim 1, wherein the first and second subwavelength configurations are used to reduce the energy cross-talk effect from an adjacent microstrip line or a differential pair when the first terminal transmits the complementary signal to the second terminal.

4. The differential microstrip lines of claim 3, wherein the plurality of slots of the first subwavelength configuration
   are periodically arranged along an inner side of the first microstrip line and an outer side of the first microstrip line that is opposite to the inner side of the first microstrip line; and
   the plurality of slots of the second subwavelength configuration are periodically arranged along an inner side of the second microstrip line and an outer side of the second microstrip line that is opposite to the inner side of the second microstrip line.

5. The differential microstrip lines of claim 3, further comprising:
   a substrate, wherein the first microstrip line and the second microstrip line are disposed on said substrate.

6. The differential microstrip lines of claim 1, wherein the plurality of slots of the first subwavelength configuration and the plurality of slots of the second subwavelength configuration are respectively configured by a plurality of rectangular convex bodies, and two adjacent rectangular convex bodies of the plurality of rectangular convex bodies are divided by a space, and an interval between the two adjacent rectangular convex bodies is the periodical arrangement length.

7. The differential microstrip lines of claim 6, wherein each of the rectangular convex bodies comprises two opposite sides and two first extended portions respectively coupled to the two opposite sides; wherein the two first extended portions extend horizontally and oppositely to each other.

8. The differential microstrip lines of claim 1, wherein the first subwavelength configuration configured by the plurality of slots are arranged along an outer side of the first microstrip line and the second subwavelength configuration configured by the plurality of slots are arranged along an outer side of the second microstrip line.

9. The differential microstrip lines of claim 8, wherein the first subwavelength configuration and the second subwavelength configuration respectively comprise a plurality of Z-shaped convex bodies arranged periodically, and each of the Z-shaped convex bodies is arranged between a first slot and a second slot of the plurality of the slots, and comprises:
a first extended portion, extending horizontally from a side of the Z-shaped convex body an opening of the second slot; and
a second extended portion, extending horizontally from a middle of the Z-shaped convex body to the first slot;
wherein a direction where the first extended portion extends is inverse to a direction where the second extended portion extends.

10. A pair of differential microstrip lines, comprising:
a first microstrip line, for transmitting a first transmission signal, and the first microstrip line having a plurality of slots arranged periodically therein;
a second microstrip line, for transmitting a second transmission signal, wherein the second microstrip is parallel to the first microstrip line and has a plurality of slots arranged periodically therein, and the second transmission signal is a complementary signal of the first transmission signal and has a 180° phase difference from the first transmission signal;
a first terminal, for respectively receiving the complementary signals and transmitting the complementary signals to the first microstrip line and the second microstrip line; and
a second terminal, for respectively outputting the complementary signals received from the first microstrip line and the second microstrip line;
wherein the plurality of slots are periodically arranged along an inner side of the first microstrip line and an outer side of the second microstrip line to form a subwavelength configuration such that a periodical arrangement length of the plurality of slots is shorter than wavelengths of the first and the second transmission signals, whereby the plurality of slots is capable of providing confinement of electromagnetic field, and reducing a mode conversion effect between a differential signal and a common mode signal when the complementary signals are transmitted from the first terminal to the second terminal.

11. The differential microstrip lines of claim 10, further comprising:
a substrate, wherein the first microstrip line and the second microstrip line are disposed on said substrate.

12. The differential microstrip lines of claim 11, wherein the plurality of slots comprises a plurality of rectangular convex bodies, and two adjacent rectangular convex bodies of the plurality of rectangular convex bodies are divided by a space, and an interval of the two adjacent rectangular convex bodies is the periodical arrangement length.

13. The differential microstrip lines of claim 12, wherein each of the rectangular convex bodies comprises two opposite sides and two first extended portions respectively coupled to the two opposite sides wherein the two first extended portions extend horizontally and oppositely to each other.

* * * * *